(12) United States Patent
Kobayashi et al.

(10) Patent No.: US 9,852,970 B2
(45) Date of Patent: Dec. 26, 2017

(54) WIRING SUBSTRATE

(71) Applicant: Shinko Electric Industries Co., Ltd., Nagano-shi, Nagano-ken (JP)

(72) Inventors: Kazuhiro Kobayashi, Nagano (JP); Junji Sato, Nagano (JP); Yasuhiko Kusama, Nagano (JP)

(73) Assignee: Shinko Electric Industries Co., Ltd., Nagano-shi, Nagano-ken (JP)

( * ) Notice: Subject to any disclaimer, the term of this patent is extended or adjusted under 35 U.S.C. 154(b) by 0 days.

(21) Appl. No.: 15/138,503

(22) Filed: Apr. 26, 2016

(65) Prior Publication Data
US 2016/0322289 A1    Nov. 3, 2016

(30) Foreign Application Priority Data

Apr. 28, 2015 (JP) .................................. 2015-091515

(51) Int. Cl.
| | | |
|---|---|---|
| H01L 23/52 | (2006.01) | |
| H01L 23/48 | (2006.01) | |
| H01L 29/40 | (2006.01) | |
| H01L 23/498 | (2006.01) | |
| H01L 23/31 | (2006.01) | |
| H01L 23/50 | (2006.01) | |
| H01L 23/00 | (2006.01) | |
| H01L 25/10 | (2006.01) | |

(52) U.S. Cl.
CPC .... H01L 23/49822 (2013.01); *H01L 23/3128* (2013.01); *H01L 23/50* (2013.01); *H01L 24/16* (2013.01); *H01L 24/32* (2013.01); *H01L 24/73* (2013.01); *H01L 25/105* (2013.01); *H01L 2224/16227* (2013.01); *H01L 2224/1703* (2013.01); *H01L 2224/32225* (2013.01); *H01L 2224/48091* (2013.01); *H01L 2224/48227* (2013.01); *H01L 2224/48235* (2013.01); *H01L 2224/73204* (2013.01); *H01L 2224/73265* (2013.01); *H01L 2225/1023* (2013.01); *H01L 2225/1058* (2013.01); *H01L 2924/15311* (2013.01); *H01L 2924/15331* (2013.01); *H01L 2924/15333* (2013.01); *H01L 2924/181* (2013.01)

(58) Field of Classification Search
CPC ..... H01L 23/49827; H01L 2224/32145; H01L 23/49822; H01L 2224/16225
USPC .................................................. 257/750, 758
See application file for complete search history.

(56) References Cited

U.S. PATENT DOCUMENTS

| | | | | |
|---|---|---|---|---|
| 7,462,784 B2* | 12/2008 | Kariya | ................ | H01L 21/4857 174/260 |
| 2010/0308451 A1* | 12/2010 | Kodani | .................... | H05K 1/09 257/690 |
| 2011/0304016 A1* | 12/2011 | Nakamura | .......... | H01L 21/4857 257/532 |

(Continued)

FOREIGN PATENT DOCUMENTS

JP    2012-191204    10/2012

*Primary Examiner* — S. V. Clark
(74) *Attorney, Agent, or Firm* — Fish & Richardson P.C.

(57) ABSTRACT

A wiring substrate includes a first wiring layer, a first insulation layer, and a second wiring layer. The first insulation layer covers an upper surface and a side surface of the first wiring layer and exposes a lower surface of the first wiring layer. The second wiring layer is stacked on at least one of a lower surface of the first insulation layer and the lower surface of the first wiring layer.

9 Claims, 23 Drawing Sheets

(56) References Cited

U.S. PATENT DOCUMENTS

2013/0069251 A1\* 3/2013 Kunimoto ......... H01L 23/49827
　　　　　　　　　　　　　　　　　　　　　257/784
2016/0295692 A1\* 10/2016 Asano .................. H05K 3/4688

\* cited by examiner

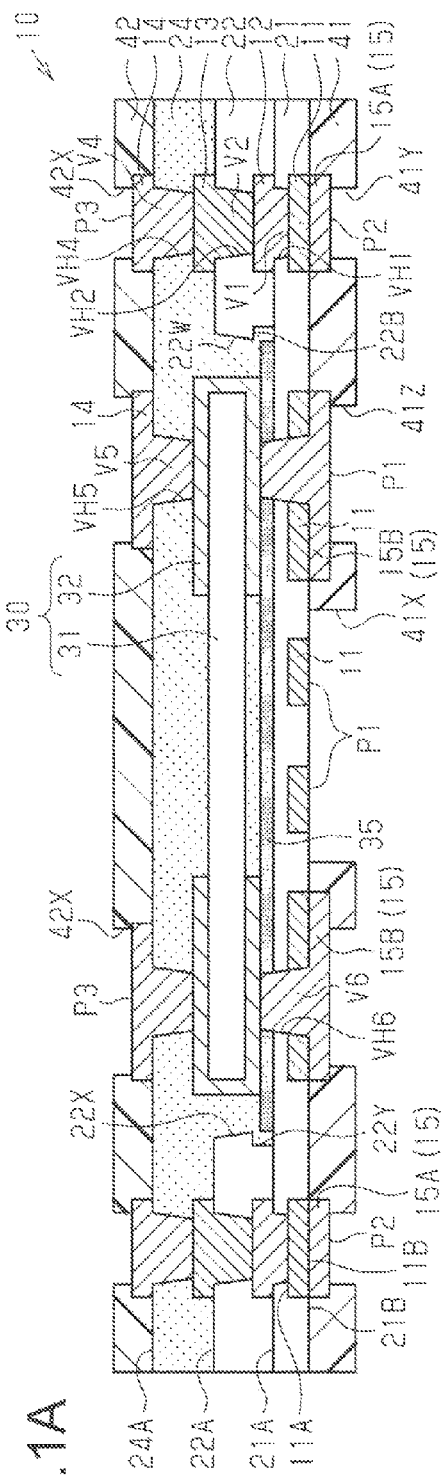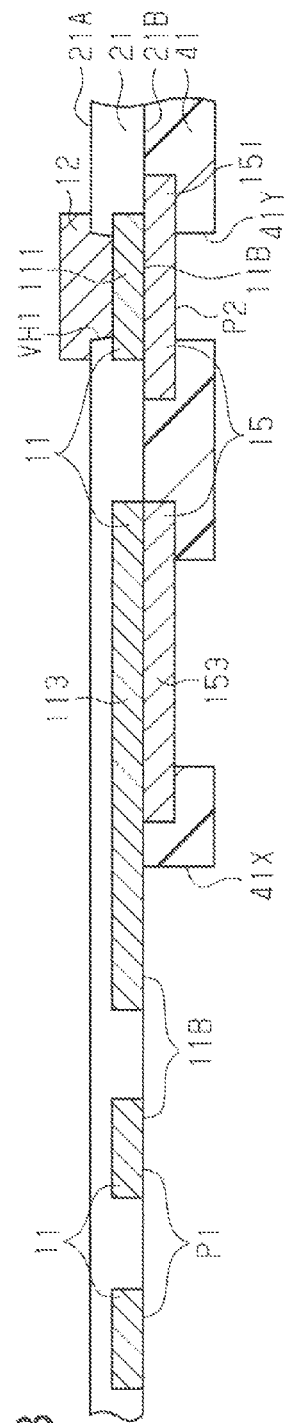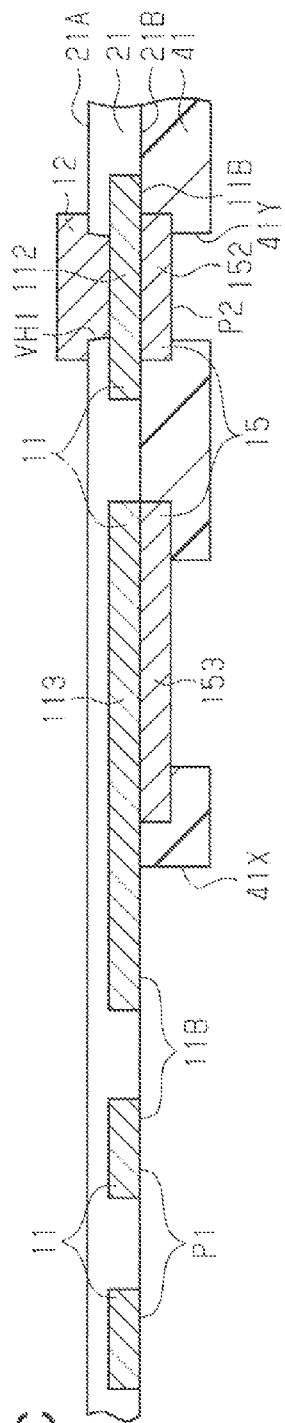

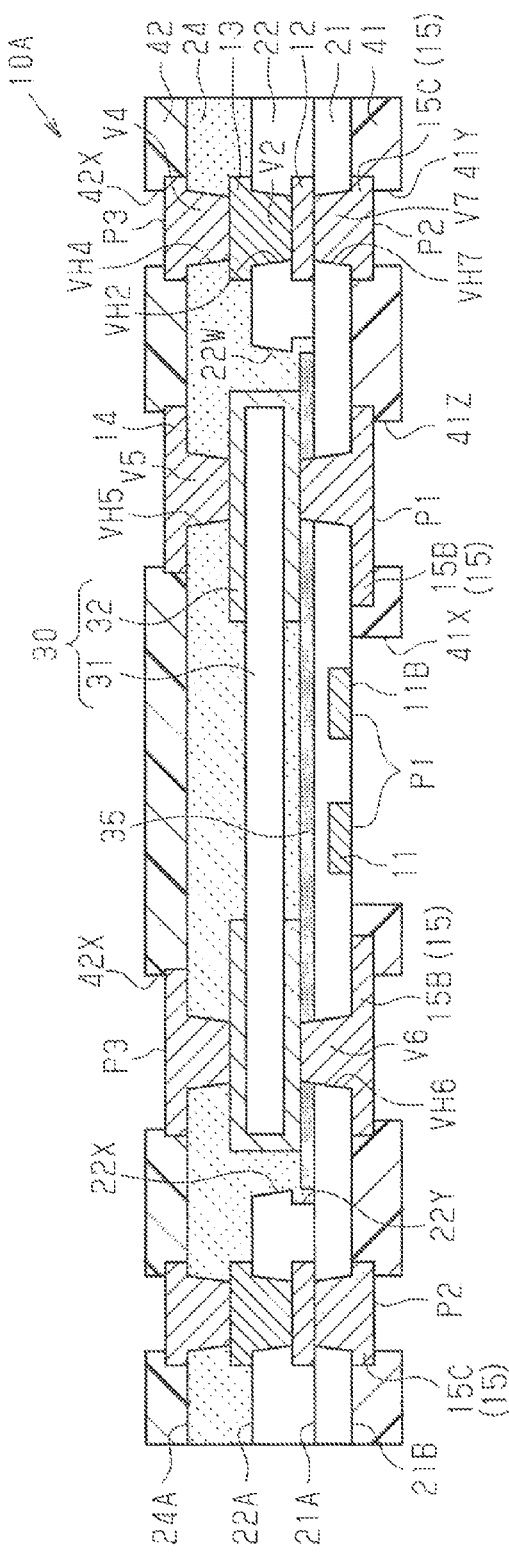
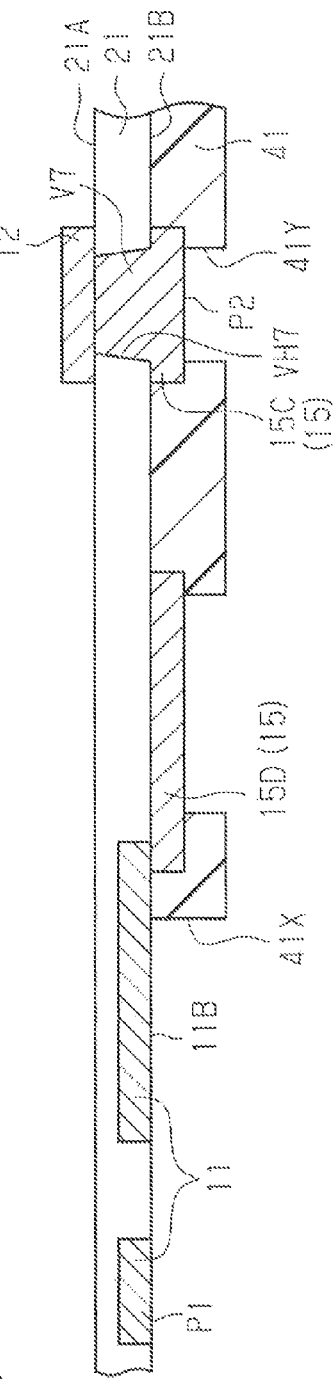
Fig.11A
Fig.11B

WIRING SUBSTRATE

CROSS-REFERENCE TO RELATED APPLICATIONS

This application is based upon and claims the benefit of priority from prior Japanese Patent Application No. 2015-091515, filed on Apr. 28, 2015, the entire contents of which are incorporated herein by reference.

FIELD

This disclosure relates to a wiring substrate and a method for manufacturing a wiring substrate.

BACKGROUND

Japanese Laid-Open Patent Publication No. 2012-191204 describes a wiring substrate that incorporates an electronic component such as a chip capacitor. The electronic component is arranged in a cavity formed in an interlayer insulation layer of the wiring substrate. Such a wiring substrate may be manufactured as described below.

First, a wiring layer including a pad is formed on a support substrate. Then, a given number of build-up wiring layers and interlayer insulation layers are alternately stacked upon one another. Further, a given interlayer insulation layer undergoes laser processing to form a cavity in the interlayer insulation layer. Then, the electronic component is arranged in the cavity, and the cavity is filled with an insulative insulation layer that entirely covers the electronic component. A wiring layer, which is electrically connected to the electronic component, is then formed on the insulation layer. Finally, the support substrate is removed.

In the wiring substrate described above, the electronic component is mounted on a metal heat dissipation plate in the cavity of the interlayer insulation layer. In such a wiring substrate, only one side of the electronic component can be electrically connected to other components. This lowers the freedom of design. In this regard, there is still room for improvement.

SUMMARY

One aspect of a wiring substrate includes a wiring substrate including a first wiring layer, a first insulation layer that covers an upper surface and a side surface of the first wiring layer and exposes a lower surface of the first wiring layer, and a second wiring layer stacked on at least one of a lower surface of the first insulation layer and the lower surface of the first wiring layer.

Other aspects and advantages of the embodiments will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematic cross-sectional view illustrating a first embodiment of a wiring substrate taken along line 1-1 in FIG. 2;

FIGS. 1B and 1C are partially enlarged cross-sectional views of the wiring substrate illustrated in FIG. 1A;

FIGS. 4A to 4D, 5A to 5D, 6A to 6D, 7A to 7D, 8A to 8C, 9A to 9E, and 10A to 10C are schematic cross-sectional views illustrating a method for manufacturing the wiring substrate of FIG. 1A, in which FIG. 6C is a partially enlarged cross-sectional view of FIG. 6B, FIGS. 7C and 7D are partially enlarged cross-sectional views of FIG. 7B, FIGS. 9B and 9C are partially enlarged cross-sectional views of FIG. 9A, and FIG. 10B is a partially enlarged cross-sectional view of FIG. 10A;

FIG. 11A is a schematic cross-sectional view illustrating a second embodiment of a wiring substrate;

FIG. 11B is a partially enlarged cross-sectional view of the wiring substrate illustrated in FIG. 11A;

DESCRIPTION OF THE EMBODIMENTS

Figure 2:
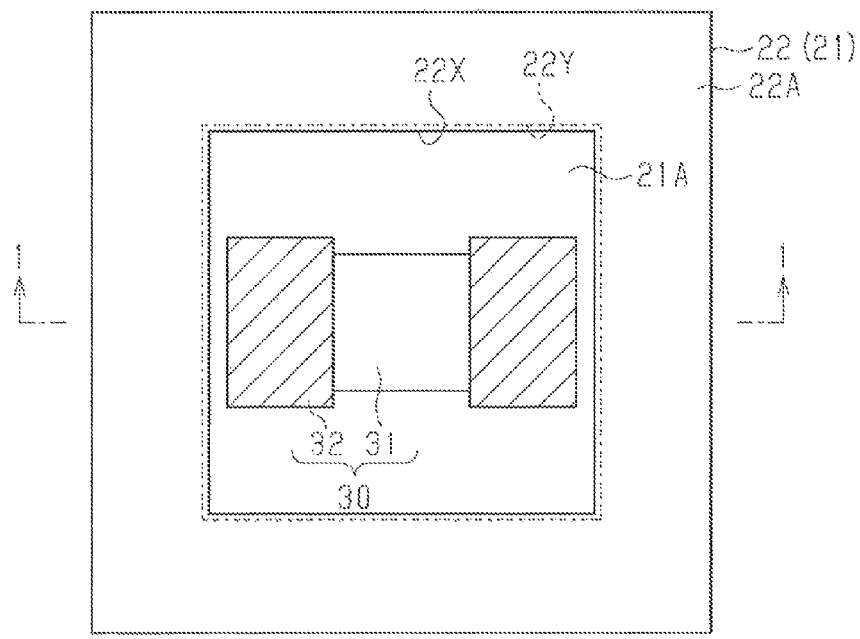
FIG. 2 is a schematic plan view illustrating the wiring substrate of FIG. 1A.

Embodiments will now be described with reference to the drawings. In the drawings, elements are illustrated for simplicity and clarity and have not necessarily been drawn to scale. To facilitate understanding, hatching lines may not be illustrated or be replaced by shadings in the cross-sectional drawings.

First Embodiment

A first embodiment will now be described with reference to FIGS. 1A to 10D. As illustrated in FIG. 1A, a wiring substrate 10 has a structure that sequentially stacks a wiring layer 11, an insulation layer 21, a wiring layer 12, an insulation layer 22, a wiring layer 13, an insulation layer 24, and a wiring layer 14. The wiring substrate 10 of the first embodiment is a coreless wiring substrate that does not include a core substrate serving as a support substrate. The coreless wiring substrate differs from a wiring substrate formed by sequentially stacking a given number of build-up layers on one surface or both surfaces of a core substrate (support substrate) by employing a typical build-up process.

The wiring substrate 10 includes at least one (in this case, one) chip capacitor 30, which is incorporated in the insulation layers 21, 22, and 24, and a wiring layer 15, which is stacked on at least one of the lower surface 11b of the wiring layer 11 and the lower surface 21B of the insulation layer 21. Further, the wiring layer 10 includes a solder resist layer 41, which is stacked on the lower surface 21B of the insulation layer 21, and a solder resist layer 42 stacked on the upper surface 24A of the insulation layer 24.

The wiring layers 11 to 15 may be formed from, for example, copper (Cu) or a copper alloy. The material of the insulation layers 21, 22, and 24 may be, for example, an insulative resin such as an epoxy resin or a polyimide resin or a resin material obtained by mixing such resins with a filler such as silica or alumina. The insulation layers 21, 22, and 24 may be formed from, for example, an insulative resin containing a reinforcement material. The insulative resin is obtained by impregnating a reinforcement material, such as a woven cloth or non-woven cloth of glass, aramid, or liquid crystal polymer (LCP) fibers, with a thermosetting resin, of which the main component is epoxy resin, polyimide resin, or the like. Further, the material of the insulation layers 21, 22, and 24 may be a thermosetting resin or a photosensitive resin.

The wiring layer 11 includes an upper surface 11A, a lower surface 11B, and side surfaces. The lower surface 11B of the wiring layer 11 is exposed from the insulation layer 21. In the present example, the lower surface 11B of the wiring layer 11 is substantially flush with the lower surface 21B of the insulation layer 21. The lower surface 11B of the wiring layer 11 may be recessed from the lower surface 21B of the insulation layer 21 toward the wiring layer 12.

The wiring layer 11 is, for example, a micro-wiring layer that is finer than the wiring layers 12 to 15. The wiring layer 11 has a line and space (L/S) that may be, for example, approximately 1 μm/1 μm to 5 μm/5 μm. The line and space (L/S) refers to the wiring width and the interval between adjacent wirings. The wiring layer 11 may have a thickness of, for example, approximately 3 to 20 μm.

The insulation layer 21 covers the upper surface 11A and the side surfaces of the wiring layer 11. Further, the insulation layer 21 exposes the lower surface 11B of the wiring layer 11. Through holes VH1 extend through the insulation layer 21 in the thickness-wise direction at given locations and partially expose the upper surface 11A of the wiring layer 11. Each through hole VH1 is, for example, tapered so that the diameter decreases, as viewed in FIG. 1A, from the upper side (side closer to wiring layer 12) toward the lower side (side closer to wiring layer 11). For example, the through hole VH1 has the shape of a generally inverted truncated cone in which the diameter of the lower opening end is smaller than that of the upper opening end. The insulation layer 21 has a thickness measured from the upper surface 11A of the wiring layer 11 to the upper surface 21A of the insulation layer 21 that is, for example, approximately 10 to 35 μm.

The wiring layer 12 is stacked on the upper surface 21A of the insulation layer 21. Each through hole VH1 is filled with a via wiring V1 that electrically connects the wiring layer 12 and the wiring layer 11. The wiring layer 12 is, for example, formed integrally with the via wiring V1. The wiring layer 12 has a thickness of, for example, approximately 8 to 25 μm.

The insulation layer 22 is formed on the upper surface 21A of the insulation layer 21 to cover the wiring layer 12. Further, the insulation layer 22 has a thickness measured from the upper surface of the wiring layer 12 to the upper surface 22A of the insulation layer 22 that is, for example, approximately 40 to 100 μm.

Through holes VH2 extend through the insulation layer 22 in the thickness-wise direction at given locations and partially expose the upper surface of the wiring layer 12. Each through hole VH2 is, for example, tapered so that the diameter decreases, as viewed in FIG. 1A, from the upper side toward the lower side.

Further, an opening 22X extends through the insulation layer 22 in the thickness-wise direction of the insulation layer 22 at a given location and partially exposes the upper surface 21A of the insulation layer 21. The opening 22X has a size corresponding to the chip capacitor 30 incorporated in the insulation layers 21, 22, and 24. That is, the opening 22X is located at the position where the chip capacitor 30 is mounted. In the first embodiment, the insulation layer 22 (second insulation layer) includes a stepped inner wall surface 22W. An upper portion of the stepped inner wall surface 22W defines the opening 22X.

The opening 22X is, for example, tapered and has a width that decreases from the upper side to the lower side as viewed in FIG. 1A. Thus, the opening 22X includes a lower opening end, which is closer to the insulation layer 21, and an upper opening end, which is closer to the upper surface 22A of the insulation layer 22 so that the lower opening end has a smaller width than the upper opening end.

As illustrated in FIG. 2, the opening 22X is tetragonal in a plan view. Further, the opening 22X is larger in size than the chip capacitor 30 in a plan view. For example, the dimensions of the opening 22X may be approximately 0.7 mm×0.4 mm to 15 mm×15 mm in a plan view. FIG. 2 is a schematic plan view illustrating the insulation layers 21 and 22 and the chip capacitor 30 of FIG. 1A.

As illustrated in FIG. 1A, a lower portion of the stepped inner wall surface 22W of the insulation layer 22 (second insulation layer) defines a recess 22Y. In detail, the lower portion of the stepped inner wall surface 22W is located outward from the upper portion of the stepped inner wall surface 22W to form the recess 22Y. The lower portion of the stepped inner wall surface 22W, which is continuous with the upper portion of the stepped inner wall surface 22W, contacts the upper surface 21A of the insulation layer 21 (first insulation layer). Accordingly, the recess 22Y is in communication with the opening 22X. The recess 22Y exposes the lower surface 22B of the insulation layer 22 to the upper side of the insulation layer 21 (refer to FIGS. 1B and 1C) at a medium location between the upper portion and lower portion of the stepped inner wall surface 22W. In the first embodiment, the region surrounded by the stepped inner wall surface 22W of the insulation layer 22 and the upper surface 21A of the insulation layer 21 defines a cavity that accommodates the chip capacitor 30. The upper surface 21A of the insulation layer 21 defines a bottom surface of the cavity, and the stepped inner wall surface 22W of the insulation layer 22 defines a stepped contour of the cavity. Thus, the recess 22Y, which is wider than the opening 22X, widens the bottom portion of the cavity. In this manner, the insulation layer 22, which is stacked on the insulation layer 21, in the wiring substrate 10 serves as a cavity formation insulation layer.

As illustrated in FIG. 2, the recess 22Y extends around the entire bottom portion of the opening 22X. However, the recess 22Y may be formed in only part of the bottom portion of the opening 22X. The recess 22Y may have a width of, for example, approximately 20 to 80 μm.

As illustrated in FIG. 1A, the chip capacitor 30 is mounted on the upper surface 21A of the insulation layer 21, which is exposed in the opening 22X, with an adhesive layer 35 arranged in between. Accordingly, the chip capacitor 30 is located in the opening 22X (cavity). In the present example, a portion of the chip capacitor 30 projects upward from the upper surface 22A of the insulation layer 22. The adhesive layer 35 is formed on the upper surface 21A of the insulation layer 21. For example, the adhesive layer 35 and the wiring layer 12 are coplanar with each other. The adhesive layer 35 may be formed from, for example, a thermosetting adhesive of an epoxy, a polyimide, or silicone.

The chip capacitor 30 includes a box-shaped capacitor body 31 and two electrode terminals 32, which are formed on the two longitudinal ends of the capacitor body 31. Each electrode terminal 32 covers the side surface and portions of the upper and lower surfaces of the corresponding end of the capacitor body 31. The chip capacitor 30 may have a thickness of, for example, approximately 80 to 120 μm. The capacitor body 31, for example, is mainly formed from a ceramic and may include an internal electrode of nickel or copper. The electrode terminals 32 may be formed from, for example, copper or a copper alloy.

The wiring layer 13 is stacked on the upper surface 22A of the insulation layer 22. Each through hole VH2 is filled with a via wiring V2 that electrically connects the wiring layer 13 and the wiring layer 12. The wiring layer 13 is, for example, formed integrally with the via wiring V2. The upper surface of the wiring layer 13 is, for example, substantially flush with the upper surface of each electrode terminal 32 of the chip capacitor 30. However, the upper surface of the wiring layer 13 may be higher than the upper surface of each electrode terminal 32. Further, as long as the difference is slight between the upper surface of the wiring layer 13 and the upper surface of each electrode terminal 32 (e.g., one third or smaller of the thickness of the insulation layer 24 measured from the upper surface 22A of the insulation layer 22 to the upper surface 24A of the insulation layer 24), the upper surface of the wiring layer 13 may be lower than the upper surface of each electrode terminal 32. The wiring layer 13 may have a thickness of, for example, approximately 10 to 20 μm.

The insulation layer 24 is formed on the upper surface 22A of the insulation layer 22. The insulation layer 24 covers the wiring layer 13 and the entire chip capacitor 30. Further, the insulation layer 24 covers the entire upper surface 22A of the insulation layer 22 exposed from the wiring layer 13. The opening 22X and the recess 22Y are filled with the insulation layer 24. In the opening 22X and the recess 22Y, the insulation layer 24 covers the upper surface 21A of the insulation layer 21, which is exposed from the adhesive layer 35, and the stepped inner wall surface 22W of the insulation layer 22. Thus, the insulation layer 24 extends into the section exposed by the recess 22Y below the lower surface 22B of the insulation layer 22.

Through holes VH4 extend through the insulation layer 24 in the thickness-wise direction at given locations and partially expose the upper surface of the wiring layer 13. Further, through holes VH5 extend through the insulation layer 24 in the thickness-wise direction at given locations and partially expose the upper surface of each electrode terminal 32. The through holes VH4 and VH5 are each, for example, tapered so that the diameter decreases, as viewed in FIG. 1A, from the upper side toward the lower side. Thus, each through hole VH4 includes a lower opening end, which is closer to the wiring layer 13, and an upper opening end, which is closer to the upper surface 24A of the insulation layer 24 so that the lower opening end has a smaller diameter than the upper opening end. In the same manner, each through hole VH5 includes a lower opening end, which is closer to the chip capacitor 30, and an upper opening end, which is closer to the upper surface 24A of the insulation layer 24 so that the lower opening end has a smaller diameter than the upper opening end. The insulation layer 24 has a thickness measured from the upper surface of the wiring layer 13 to the upper surface 24A of the insulation layer 24 that is, for example, approximately 15 to 45 μm.

The wiring layer 14 is stacked on the upper surface 24A of the insulation layer 24. The wiring layer 14 is the outermost wiring layer (here, the uppermost wiring layer) of the wiring substrate 10. The wiring layer 14 includes a first wiring pattern and a second wiring pattern in the same layer. Each through hole VH4 is filled with a via wiring V4 that electrically connects the first wiring pattern of the wiring layer 14 to the wiring layer 13. In the present example, the first wiring pattern of the wiring layer 14 is formed integrally with the via wiring V4. Each through hole VH5 is filled with a via wiring V5 that electrically connects the second wiring pattern (fifth wiring layer) of the wiring layer 14 to the corresponding electrode terminal 32. In the present example, the second wiring pattern of the wiring layer 14 is formed integrally with the via wiring V5. The wiring layer 14 may be laid out on the upper surface 24A of the insulation layer 24 in the planar direction (direction orthogonal to the thickness-wise direction in a cross-sectional view). Further, the first wiring pattern of the wiring layer 14 connected to the wiring layer 13 may be electrically connected to the second wiring pattern of the wiring layer 14 connected to the electrode terminals 32. The wiring layer 14 may have a thickness of, for example, 10 to 20 μm.

The wiring layer 15 projects downward from the lower surface 21B of the insulation layer 21. The wiring layer 15 is thicker than the wiring layer 11. Further, the wiring layer 15 may have a thickness of, for example, approximately 10 to 20 μm.

In the first embodiment, the wiring layer 15 is stacked on the lower surface 11B of the wiring layer 11. For example, the wiring layer 15 is stacked directly on the lower surface 11B of the wiring layer 11 and directly connected to the wiring layer 11. Thus, the wiring layer 15 has a wiring pattern laid out at locations overlapping the wiring layer 11.

In the example illustrated in FIG. 1A, the wiring layer 15 includes a wiring pattern completely overlapping a certain wiring pattern of the wiring layer 11. However, the wiring pattern of the wiring layer 15 is not necessarily limited to the shape illustrated in FIG. 1A. For example, as illustrated at the right in FIG. 1B, the wiring pattern 15 may include a wiring pattern 151 that is larger in size than a wiring pattern 111 of the wiring pattern 11 in a plan view. Alternatively, for example, as illustrated at the right in FIG. 1C, the wiring layer 15 may include a wiring pattern 152 that is smaller in size than a wiring 112 of the wiring pattern 11 in a plan view. Further, as illustrated at the middle in FIGS. 1B and 1C, the wiring pattern 15 may include a wiring pattern 153 overlapping only a portion of a wiring pattern 113 of the wiring layer 11 in a plan view. Alternatively, for example, the wiring layer 15 may be laid out in a planar direction (direction orthogonal to thickness-wise direction) overlapping only a certain wiring portion of the wiring layer 11 (e.g., wiring pattern 111 or 112 functioning as pad). That is, the wiring layer 15 may be stacked only on a portion of the lower surface 11B of the wiring layer 11.

For example, the wiring layer 15 may be laid out in the planar direction on the lower surface 21B of the insulation layer 21 where the wiring layer 11 is not formed. In this case and in the example illustrated in FIG. 1B, the wiring layer 15 is formed on the lower surface 11B of the wiring layer 11 and the lower surface 21B of the insulation layer 21.

As illustrated in FIG. 1A, the wiring layer 15 includes first wiring patterns 15A. The first wiring patterns 15A are directly connected to the wiring patterns of the wiring layer 11 that are electrically connected to the wiring layer 12. Further, the wiring layer 15 includes second wiring patterns 15B electrically connected to the electrode terminals 32 of the chip capacitor 30.

In this example, through holes VH6 (sixth through hole) extend through the wiring layer 11, the insulation layer 21, and the adhesive layer 35 in the thickness-wise direction and partially expose the lower surface of each electrode terminal 32. Each through hole VH6 is filled with a via wiring V6 (sixth via wiring). The through hole VH6 is, for example, tapered so that the diameter decreases, as viewed in FIG. 1A, from the lower side toward the upper side. Thus, each through hole VH6 includes an upper opening end, which is closer to the chip capacitor 30, and a lower opening end, which is closer to the wiring layer 15, and the upper opening end has a smaller diameter than the lower opening end. The via wirings V6 in the through holes VH6 electrically connect the second wiring patterns 15B of the wiring layer 15 to the electrode terminals 32. For example, the second wiring patterns 15B are formed integrally with the via wirings V6. Further, the wiring layer 11, which is located directly on the second wiring patterns 15B and directly connected to the second wiring patterns 15B, is electrically connected to the via wirings V6 in the through holes VH6.

In the wiring substrate 10, the wiring layer 11 includes wiring patterns that are directly connected to the wiring layer 15 (in this example, wiring patterns 15A and 15B) and wiring patters that are not directly connected to the wiring layer 15. For example, the wiring layer 11 includes wiring patterns, which are micro-fabricated with a high density, in a region of the wiring substrate 10 where a semiconductor chip 51 (refer to FIG. 3) is mounted. The wiring layer 15 is not formed on such high-density, micro-fabricated wiring patterns of the wiring layer 11.

The solder resist layer 41 is stacked on the lower surface 21B of the insulation layer 21, which is the outermost insulation layer (here, the lowermost insulation layer). The solder resist layer 41 may be formed from, for example, an insulative resin such as an epoxy resin or an acrylic resin. The solder resist layer 41 may have a thickness measured from the lower surface of the wiring layer 15 to the lower surface of the solder resist layer 41 that is, for example, approximately 10 to 30 μm.

The solder resist layer 41 includes an opening 41X that exposes at least a portion of the wiring layer 11 (lowermost wiring layer) as pads P1. In this example, the opening 41X is located at a position corresponding to the region where the semiconductor chip 51 (refer to FIG. 3) is mounted. For example, the opening 41X partially exposes the lower surface 11B of the wiring layer 11 and the lower surface 21B of the insulation layer 21 in the mounting region. In this example, the wiring layer 15 is not formed immediately below the wiring layer 11 exposed from the opening 41X.

Further, the solder resist layer 41 includes openings 41Z that expose portions of the wiring layer 15 (e.g., second wiring pattern 15B as pads P1. In this example, the openings 41Z expose portions of the lower surface of the wiring layer 15 (second wiring patterns 15B) where the semiconductor chip 51 (refer to FIG. 3) is mounted. Further, the solder resist layer 41 includes openings 41Y that expose portions of the wiring layer 15 (e.g., first wiring patterns 15A) as pads P2. In this example, the openings 41Y are formed in a region outside the mounting region of the semiconductor chip 51.

The pads P1 function as, for example, electronic component mounting pads that are electrically connected to another electronic component such as a semiconductor chip. Thus, the surface of the wiring substrate 10 including the pads P1 serves as a chip mounting surface. The connection pads P2 are used to, for example, electrically connect another wiring substrate or another semiconductor device.

When necessary, a surface-processed layer may be formed on the surface of each pad P1 and the surface of each connection pad P2. Examples of a surface-processed layer include a gold (Au) layer, a nickel (Ni) layer/Au layer (metal layer obtained by stacking Ni layer and Au layer in this order), and an Ni layer/palladium (Pd) layer/Au layer (metal layer obtained by stacking Ni layer, Pd layer, and Au layer in this order). The Ni layer, Au layer, and Pd layer may be an electroless plating metal layer, which is formed through electroless plating, or an electrolytic plating metal layer, which is formed through electrolytic plating. The Ni layer is a metal layer of Ni or an Ni alloy. The Au layer is a metal layer of Au or an Au alloy. The Pd layer is a metal layer of Pd or a Pd alloy. Further, a surface-processed layer that undergoes an anti-oxidation process such as an organic solderability preservative (OSP) process may be formed on the surfaces of the pads P1 and the surfaces of the connection pads P2. For example, when undergoing the OSP process, an organic film of an azole compound or an imidazole compound is formed as the surface-processed layer on the surfaces of the pads P1 and the surfaces of the connection pads P2.

The solder resist layer 42 is stacked on the upper surface 24A of the insulation layer 24, which is the outermost insulation layer (here, the uppermost insulation layer). The solder resist layer 42 may be formed from, for example, an insulative resin such as an epoxy resin or an acrylic resin. The solder resist layer 42 may have a thickness of, for example, approximately 10 to 30 μm.

The solder resist layer 42 includes openings 42X that expose portions of the wiring layer 14 as external connection pads P3. The external connection pads P3 are connected to external connection terminals such a solder balls or lead pins used to mount the wiring substrate 10 onto a mounting substrate such as a motherboard. In the first embodiment, the surface of the wiring substrate 10 where the external connection pads P3 are located is defined as the external connection terminal surface. When necessary, a surface-processed layer may be formed on the surfaces of the external connection pads P3. Examples of a surface-processed layer include an Au layer, an Ni layer/Au layer, and an Ni layer/Pd layer/Au layer. Further, for example, an anti-oxidation process such as an OSP process may be performed to form an organic film of an azole compound or an imidazole compound as the surface-processed layer on the surfaces of the external connection pads P3. Further, portions of the wiring layer 14 exposed from the openings 42X may be used as external connection terminals. Alternatively, the surface-processed layer formed on the wiring layer 14 may be used as external connection terminals.

Figure 3:
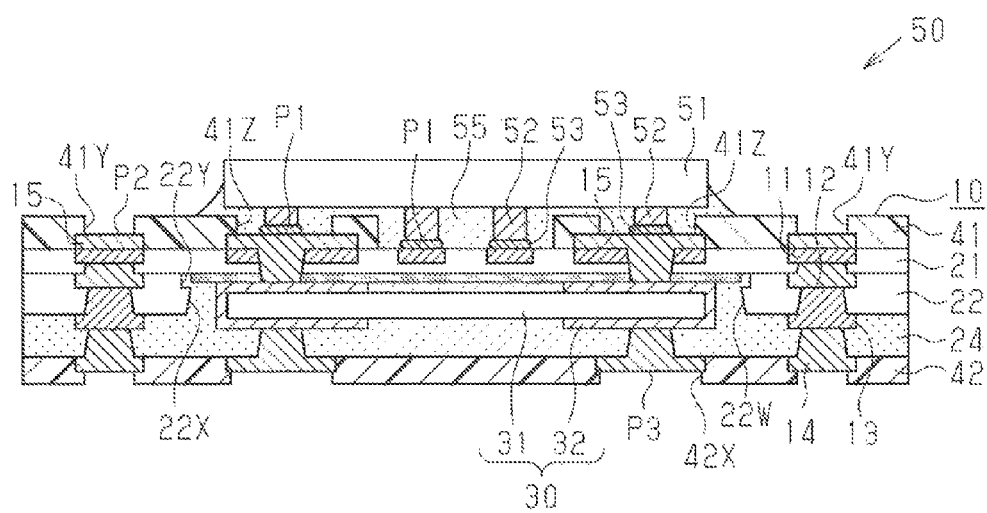
FIG. 3 is a schematic cross-sectional view illustrating a semiconductor device that includes the wiring substrate of FIG. 1A.

The structure of a semiconductor device 50 will now be described with reference to FIG. 3. FIG. 3 illustrates the wiring substrate 10 of FIG. 1A reversed upside down.

The semiconductor device 50 includes the wiring substrate 10, at least one (in this case, one) semiconductor chip 51, and an underfill resin 55. The semiconductor chip 51 is flip-chip-mounted on the wiring substrate 10. In the present example, connection terminals 52, which are arranged on a circuit formation surface (here, lower surface) of the semiconductor chip 51, are bonded to the pads P1 of the wiring substrate 10 by bonding members 53 to electrically connect the semiconductor chip 51 to the pads P1 (wiring layers 11 and 15) via the connection terminals 52 and the bonding members 53.

As described above, the chip mounting surface of the wiring substrate 10 includes the pads P1 that are formed by the wiring layer 11 and the pads P1 that are formed by the wiring layer 15. Thus, the pads P1 on the chip mounting surface of the wiring substrate 10 have different heights. Accordingly, the thickness (height) of at least either one of the connection terminals 52 and the bonding members 53 in the semiconductor chip 51 is adjusted in accordance with the height of each pad P1. In the example of FIG. 3, the thickness of each connection terminal 52 is adjusted in accordance with the height of each pad P1. That is, the connection terminal 52 that is bonded to the pad P1 formed by the wiring layer 11 is thicker than the connection terminal 52 that is bonded to the pad P1 formed by the wiring layer 15.

The semiconductor chip 51 may be a logic chip such as a central processing unit (CPU) chip or a graphics processing unit (GPU) chip. Further, the semiconductor chip 51 may be a memory chip such as a dynamic random access memory (DRAM) chip, a static random access memory (SRAM) chip, or a flash memory chip. Moreover, a logic chip and a memory chip or the like may be combined and mounted as a plurality of semiconductor chips 51 on the wiring substrate 10.

The connection terminals 52 may be, for example, metal posts. The connection terminals 52 are rod-shaped connection terminals extending downward from the circuit formation surface of the semiconductor chip 51. The connection terminals 52 may be formed from, for example, copper or a copper alloy. In addition to metal posts, for example, gold bumps may be used as the connection terminals 52.

The bonding members 53 are bonded with the pads P1 and the connection terminals 52. The bonding members 53 may be, for example, a tin (Sn) layer or a solder layer. The solder layer may be formed from, for example, a lead-free solder of Sn-silver (Ag), Sn—Cu, or Sn—Ag—Cu.

The gap between the wiring substrate 10 and the semiconductor chip 51 is filled with the underfill resin 55. The underfill resin 55 may be formed from, for example, an insulative resin such as an epoxy resin.

In the first embodiment, the insulation layer 21 is one example of a first insulation layer, the insulation layer 22 is one example of a second insulation layer, and the insulation layer 24 is one example of a third insulation layer. Further, the wiring layer 11 is one example of a first wiring layer, the wiring layer 15 is one example of a second wiring layer, the wiring layer 12 is one example of a third wiring layer, the wiring layer 13 is one example of a fourth wiring layer, and the wiring layer 14 is one example of a fifth wiring layer. Further, each through hole VH2 is one example of a first through hole, each through hole VH1 is one example of a third through hole, each through hole VH5 is one example of a fifth through hole, and each through hole VH6 is one example of a sixth through hole. Further, each via wiring V2 is one example of a first via wiring, each via wiring V1 is one example of a third via wiring, each via wiring V5 is one example of a fifth via wiring, and each via wiring V6 is one example of a sixth via wiring.

A method for manufacturing the wiring substrate 10 will now be described. To aid understanding, components that ultimately function as the elements of the wiring substrate 10 are denoted by the reference characters added to such elements.

Figure 4A:
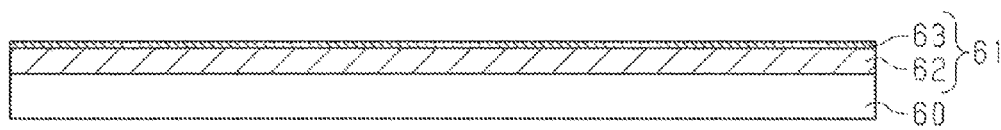

In the step illustrated in FIG. 4A, a carrier-added metal foil 61 is adhered to the upper surface of a support 60. The support 60 may be, for example, a pre-peg, which is obtained by impregnating a reinforcement material, such as a woven cloth or non-woven cloth of glass, aramid, or LCP fibers, with a thermosetting rein such as epoxy resin or polyimide resin. The carrier-added metal foil 61 includes a carrier layer 62 and an extremely thin metal foil 63 stacked on the carrier layer 62 with a defoliation layer (not illustrated) arranged in between. The carrier layer 62 serves as a support that facilitates handling of the metal foil 63. The carrier layer 62 is, for example, a copper foil having a thickness of approximately 15 to 70 μm. The metal foil 63 is, for example, a copper foil having a thickness of approximately 0.5 to 5 μm.

The material of the carrier layer 62 is not limited to copper and may be a conductive metal layer, which is formed by a metal other than copper, or an insulation layer of resin or the like. Further, the material of the metal foil 63 is not limited to copper and may be a metal other than copper.

Figure 4B:
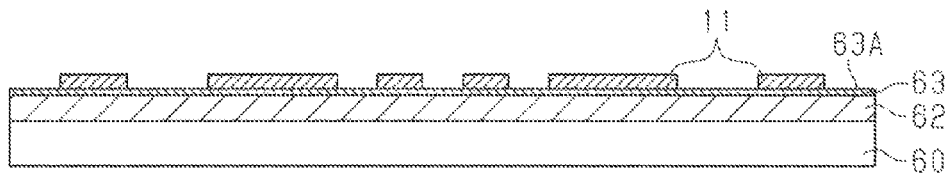

In the step illustrated in FIG. 4B, the wiring layer 11 is formed on the upper surface 63A of the metal foil 63. The wiring layer 11 may be formed through, for example, a semi-additive process. In the present example, a resist pattern (not illustrated), which includes openings shaped in conformance with the wiring layer 11, is first formed on the upper surface 63A of the metal foil 63. Then, electrolytic copper plating is performed using the metal foil 63 as a power supplying layer to deposit a copper plating film on the upper surface 63A of the metal foil 63 exposed from the openings of the resist pattern. The resist pattern is then removed. This allows the wiring layer 11 to be formed without the need to perform etching. This forms the wiring layer 11. In addition to the semi-additive process, various types of wiring formation processes such as a subtractive process may be employed to form the wiring layer 11.

Figure 4C:
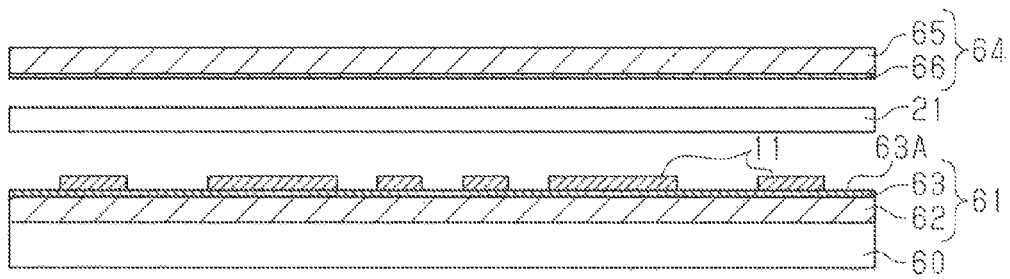

In the step illustrated in FIG. 4C, the insulation layer 21 and a carrier-added metal foil 64 are arranged above the structure illustrated in FIG. 4B. The insulation layer 21 used in the step of FIG. 4C is, for example, a pre-preg that is in a B-stage (i.e., semi-hardened state). The pre-preg is obtained by, for example, impregnating a reinforcement material, such as a woven cloth or non-woven cloth of glass, aramid, or LCP fibers, with a thermosetting rein such as epoxy resin or polyimide resin. An underlayer (not illustrated) is formed on a surface (here, upper surface) of the insulation layer 21 that faces the carrier-added metal foil 64.

In the same manner as the carrier-added metal foil 61, the carrier-added metal foil 64 includes a carrier layer 65 and an extremely thin metal foil 66 stacked on the carrier layer 65 with a defoliation layer (not illustrated) arranged in between. The carrier-added metal foil 64 faces the insulation layer 21.

Then, under a depressurized condition (e.g., vacuum atmosphere), the structure illustrated in FIG. 4C (support 60, carrier-added metal foil 61, wiring layer 11, insulation layer 21, and carrier-added metal foil 64) is heated to a given temperature (e.g., 180° C. to 230° C.) and pressurized in a direction orthogonal to the upper surface 63A of the metal foil 63 in a cross-sectional view (vertical direction as viewed in FIG. 4C). This hardens the B-stage insulation layer 21. Then, the carrier layer 65 is removed from the metal foil 66. In this case, the defoliation layer (not illustrated) is arranged between the carrier layer 65 and the metal foil 66 in the carrier-added metal foil 64. Thus, the adhesive force is weak between the carrier layer 65 and the metal foil 66. This allows the carrier layer 65 to be easily separated from the metal foil 66 and obtain the structure illustrated in FIG. 4D.

The insulation layer 21 may be formed from a resin that does not include a reinforcement material such as a glass cloth or a resin that contains only a filler. A method for forming the insulation layer 21 will now be described. For example, when using a resin film as the insulation layer 21, the resin film is laminated on the upper surface 63A of the metal foil 63. While pressing the resin film, a heat treatment is performed at a temperature that is greater than or equal to the hardening temperature (e.g., approximately 130° C. to 200° C.) to form the insulation layer 21. The resin film may be, for example, a thermosetting resin film of which the main component is an epoxy resin. The insulation layer 21 may be a liquid or paste of an insulative resin. In this case, spin coating is performed to apply a liquid or paste of an insulative resin to the upper surface 63A of the metal foil 63. Then, the applied insulative resin undergoes a heat treatment at a temperature greater than or equal to the hardening temperature. This hardens the insulative resin and forms the insulation layer 21. The liquid or paste of insulative resin may be, for example, a thermosetting resin of which the main component is an epoxy resin.

Figure 5A:
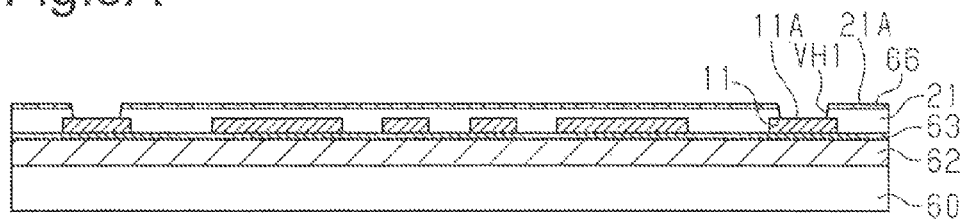

In the step illustrated in FIG. 5A, the through holes VH1, which extend through the insulation layer 21 and the metal foil 66 in the thickness-wise direction, are formed to expose portions of the upper surface 11A of the wiring layer 11. The through holes VH1 may be formed through, for example, laser processing that uses a $CO_2$ laser or a YAG laser. When the insulation layer 21 is formed from a photosensitive resin, a photolithography process may be performed to form the through holes VH1.

When forming the through holes VH1 through laser processing, a desmear process is performed to remove resin residues (resin smears) of the insulation layer 21 from the upper surface 11A of the wiring layer 11 exposed in the through holes VH1. The desmear process may be performed by using, for example, a permanganate process.

Figure 5B:
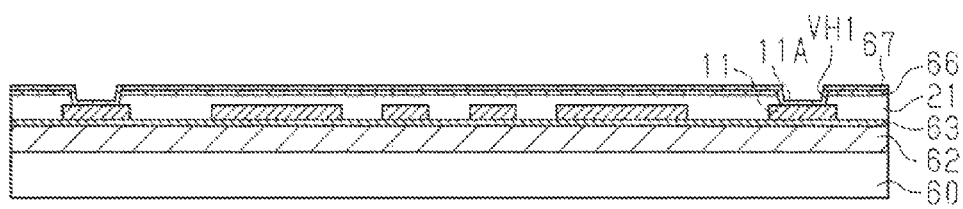

In the step illustrated in FIG. 5B, a seed layer 67 is formed. The seed layer 67 continuously covers the upper surface of the metal foil 66, the wall surfaces defining the through holes VH1 in the insulation layer 21, and the upper surface 11A of the wiring layer 11 exposed in the through holes VH1. The seed layer 67 may be formed through, for example, an electroless plating process (e.g., electroless copper plating process) or a sputtering process. The seed layer 67 may be formed from, for example, copper or a copper alloy.

Figure 5C:
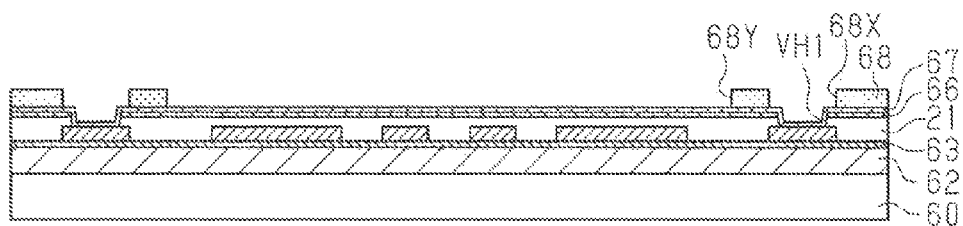

In the step illustrated in FIG. 5C, a resist layer 68, which includes opening patterns 68X and 68Y at given locations, is formed on the seed layer 67. The opening patterns 68X expose the seed layer 67 at portions corresponding to the regions where the wiring layer 12 is formed (refer to FIG. 1A). The opening pattern 68Y exposes the seed layer 67 at a portion corresponding to the region where the chip capacitor 30 is mounted (refer to FIG. 1A). For example, the opening pattern 68Y is larger than the opening 22X (refer to FIG. 1A) in a plan view.

The resist layer 68 may be formed from a material that is resistant to plating in the following plating process. For example, the resist layer 68 may be a photosensitive dry film resist or a photoresist liquid. Such a material of the resist layer 68 may be, for example, a novolac resin or an acrylic resin. For example, when using a photosensitive dry film resist, thermocompression bonding is performed to laminate a dry film on the upper surface of the seed layer 67, and a photolithography process is performed to pattern the dry film and form the resist layer 68 that includes the opening patterns 68X and 68Y. When using a photoresist liquid, similar steps are performed to form the resist layer 68.

Figure 5D:
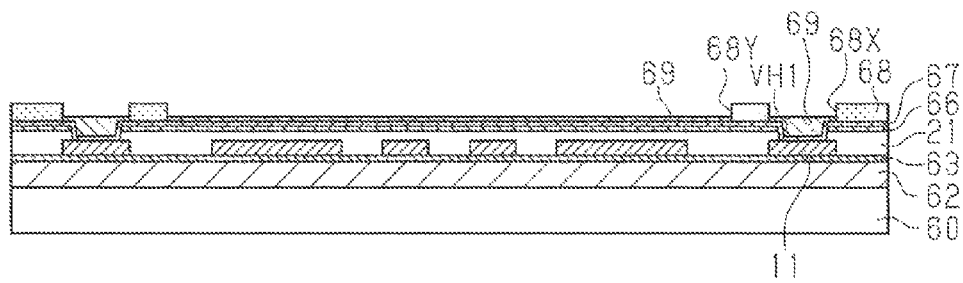

In the step illustrated in FIG. 5D, electrolytic plating is performed on the upper surface of the seed layer 67 using the resist layer 68 as a plating mask and the seed layer 67 as a plating power supplying layer. In the present example, electrolytic copper plating is performed to form an electrolytic copper plating layer 69 on the upper surface of the seed layer 67 exposed in the opening patterns 68X and 68Y of the resist layer 68.

Then, for example, an alkaline defoliation liquid is used to remove the resist layer 68. This obtains the structure illustrated in FIG. 6A. Further, etching is performed using the electrolytic copper plating layer 69 as an etching mask to remove the seed layer 67 and the metal foil 66 that are unnecessary. As illustrated in FIG. 6B, this forms the metal layer 70 on the upper surface 21A of the insulation layer 21. The metal layer 70, which is larger than the mounting region of the chip capacitor 30 (refer to FIG. 1A), includes the metal foil 66, the seed layer 67, and the electrolytic copper plating layer 69. As illustrated in FIG. 6C, the through holes VH1 are each simultaneously filled with the via wiring V1, which is formed by the seed layer 67 and the electrolytic copper plating layer 69. Further, the wiring layer 12 is formed simultaneously on the upper surface 21A of the insulation layer 21 by the metal foil 66, the seed layer 67, and the electrolytic copper plating layer 69.

Figure 4D:
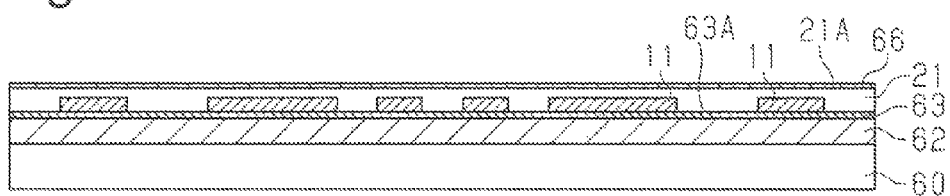
Figure 6A:
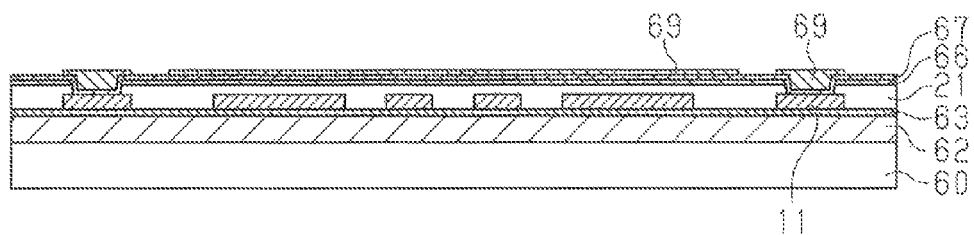
Figure 6B:
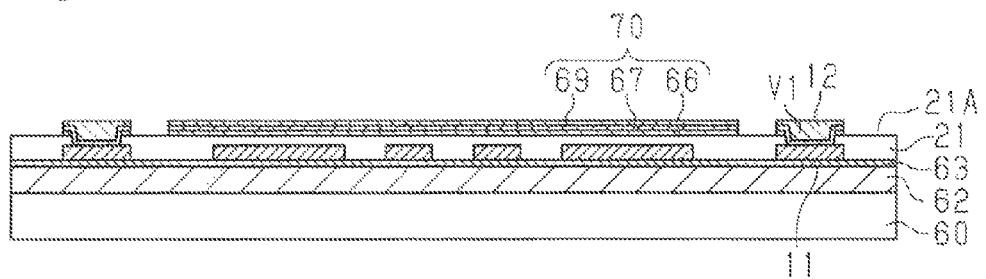
Figure 6C:
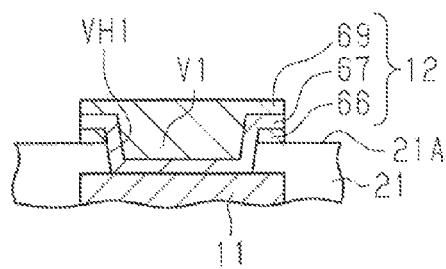
Figure 6D:
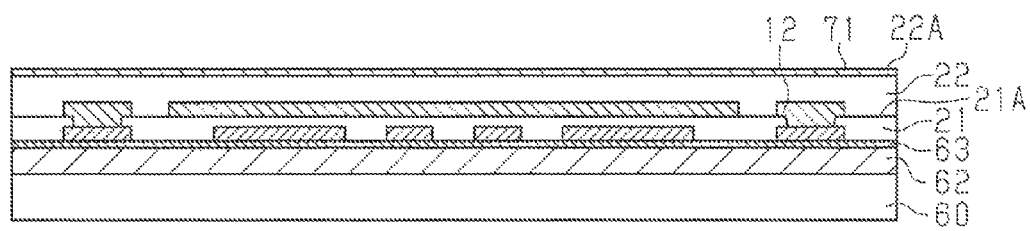

In the step illustrated in FIG. 6D, the insulation layer 22, which entirely covers the surfaces (i.e., entire upper surface and entire side surfaces) of the wiring layer 12, and a metal foil 71, which entirely covers the upper surface 22A of the insulation layer 22, are sequentially stacked on the upper surface 21A of the insulation layer 21 in the same manner as the steps illustrated in FIGS. 4C and 4D.

Then, etching is performed to remove the metal foil 71. In the step illustrated in FIG. 7A, the opening 22X is formed extending through the insulation layer 22 in the thickness-wise direction. The opening 22X exposes the metal layer 70 at a portion corresponding to the mounting region of the chip capacitor 30 (refer to FIG. 1A). The opening 22X is smaller than the metal layer 70 in a plan view. Thus, the peripheral portion of the metal layer 70 is covered by the insulation layer 22. The opening 22X may be formed through, for example, laser processing that uses a $CO_2$ laser or a YAG laser. In such a case, the metal layer 70 functions as a stopper layer during laser processing. This limits damages, which would be caused by excessive laser processing, to the insulation layer 21 that is located under the insulation layer 22.

Alternatively, the metal foil 71 (refer to FIG. 6D) may be used as a conformal mask to form the opening 22X. For example, the metal foil 71 is etched and patterned to form an opening (not illustrated) having the same shape in a plan view as the opening 22X. Then, laser processing is performed on the insulation layer 22 exposed in the opening of the metal foil 71 to form the opening 22X in the insulation layer 22. Further, etching is performed to remove the metal foil 71. In this case, the metal foil 71, which is patterned during the etching, functions as a mask during laser processing. This allows the opening 22X to be accurately formed with the desired shape. Further, the metal layer 70 also functions as a stopper layer during laser processing in this case and limits damages to the insulation layer 21.

When the insulation layer 22 is formed from a photosensitive resin, a photolithography process may be performed to form the opening 22X.

Figure 7A:
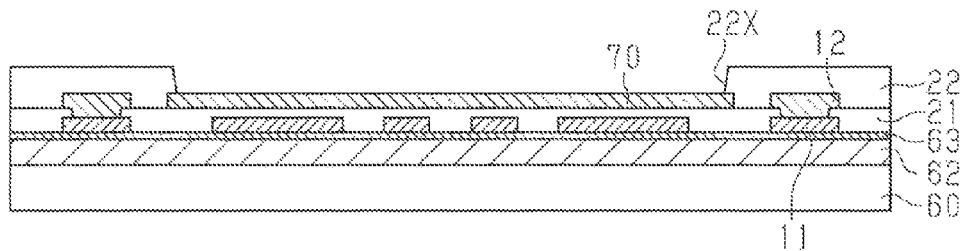
Figure 7B:
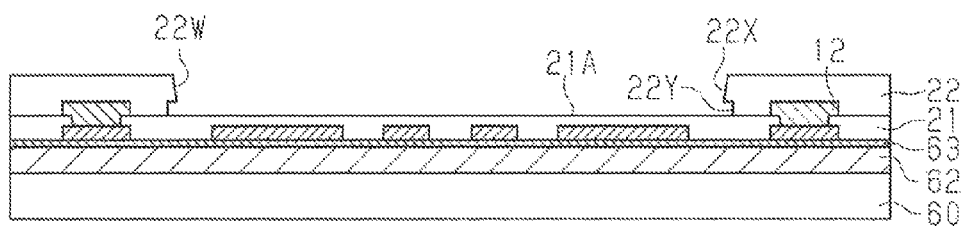
Figure 7C:
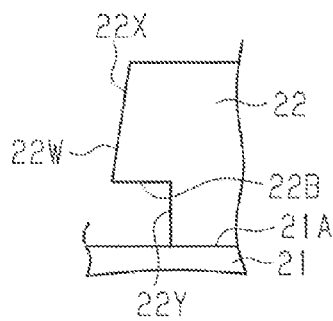
Figure 7D:
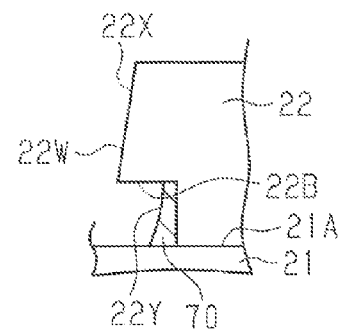

In the step illustrated in FIG. 7B, etching is performed to remove the metal layer 70. For example, isotropic etching is performed using the insulation layer 22 as an etching mask to remove the metal layer 70. The isotropic etching causes a side etching effect in which etching occurs in the planar direction of the metal layer 70. This removes the metal layer 70 from the insulation layer 22. Consequently, as illustrated in FIG. 7B, the recess 22Y is formed below the opening 22X by the lower portion of the stepped inner wall surface 22W of the insulation layer 22. In this case, depending on conditions of the etching process (e.g., processing time), the metal layer 70 covered by the insulation layer 22 (refer to FIG. 7A) may be completely removed as illustrated in FIG. 7C or be partially left as illustrated in FIG. 7D. However, as long as at least a portion of the metal layer 70 covered by the insulation layer 22 is removed when the recess 22Y is formed, the metal layer 70 may be partially left in the recess 22Y. When the metal layer 70 is partially left in the recess 22Y, the recess 22Y is defined by the region surrounded by the side surface of the metal layer 70, the lower surface 22B of the insulation layer 22, and the upper surface 21A of the insulation layer 21 as illustrated in FIG. 7D.

Figure 8A:
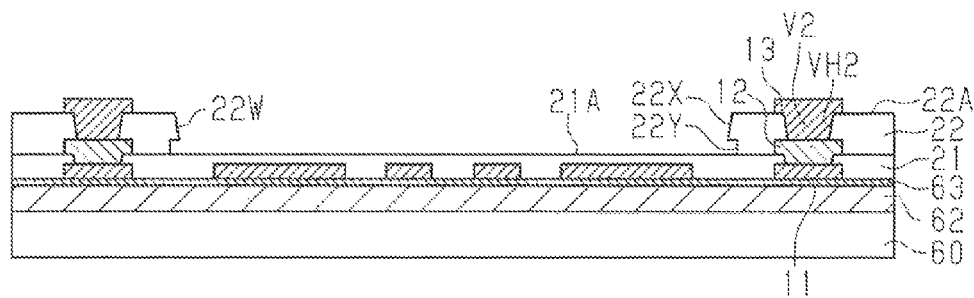

In the step illustrated in FIG. 8A, the through holes VH2 are formed in the insulation layer 22 in the same manner as the step illustrated in FIG. 5A. Then, the through holes VH2 are filled with the via wirings V2 in the same manner as the steps illustrated in FIGS. 5B to 6B. Further, the wiring layer 13, which is electrically connected to the wiring layer 12 by the via wirings V2, is formed on the upper surface 22A of the insulation layer 22.

Figure 8B:
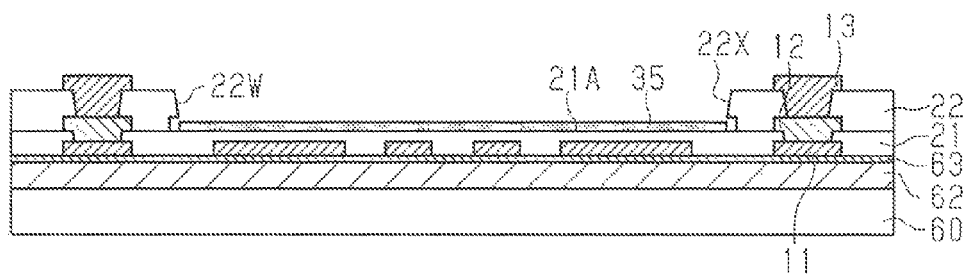

In the step illustrated in FIG. 8B, the adhesive layer 35 is formed on the upper surface 21A of the insulation layer 21 that is exposed in the opening 22X. The adhesive layer 35 is formed by, for example, applying a liquid of a resin or a paste of a resin to the upper surface 21A of the insulation layer 21. The adhesive layer 35 is formed by, for example, an adhesive of an epoxy resin. In the present example, the adhesive layer 35 is in an A-stage (state before hardening) in the step illustrated in FIG. 8B. In this step, the adhesive layer 35 may instead be in a B-stage.

Figure 8C:
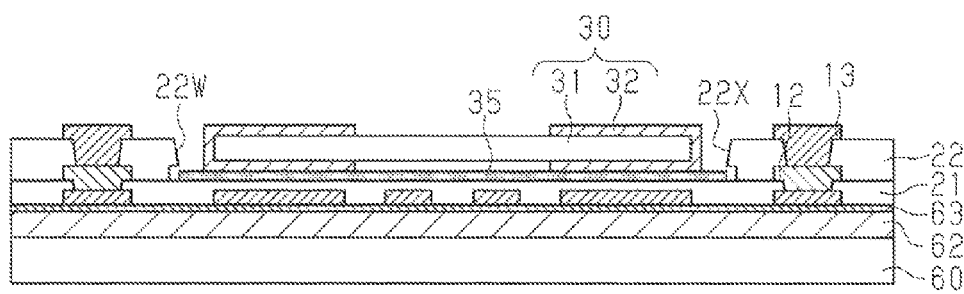

In the step illustrated in FIG. 8C, a mounter is used to mount the chip capacitor 30 in the adhesive layer 35 in the opening 22X. The lower surface of each electrode terminal 32 of the chip capacitor 30 is fixed to the upper surface of the adhesive layer 35.

Figure 9A:
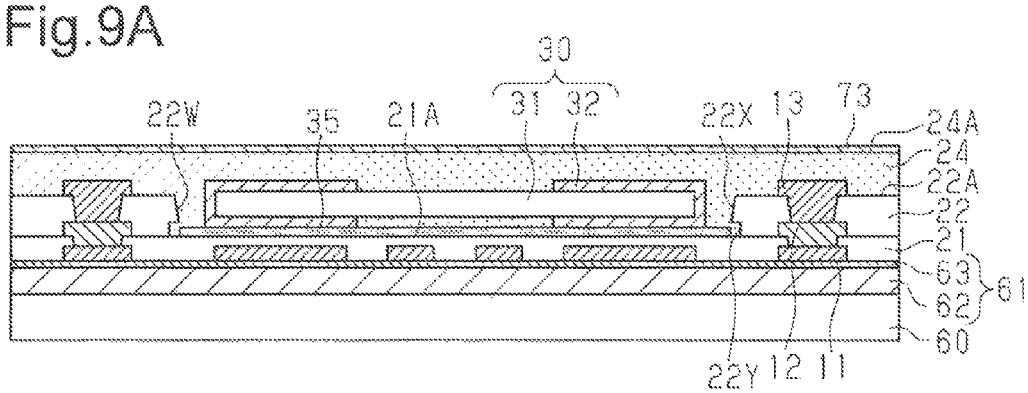
Figure 9B:
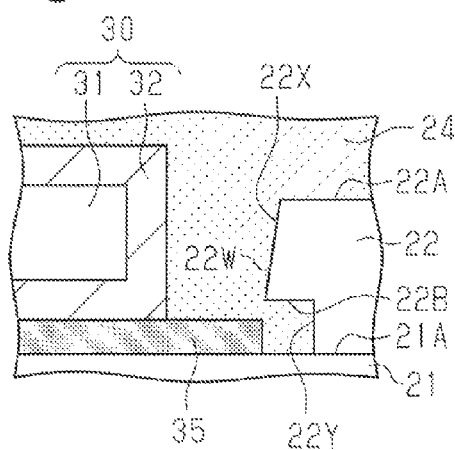
Figure 9C:
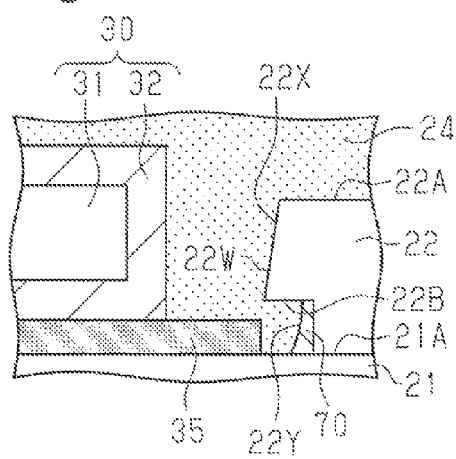

In the step illustrated in FIG. 9A, the insulation layer 24 is stacked on the upper surface 22A of the insulation layer 22 in the same manner as the steps illustrated in FIGS. 4C and 4D. The insulation layer 24 entirely covers the wiring layer 13, and the opening 22X and the recess 22Y are filled with the insulation layer 24. Further, a metal foil 73 is formed covering the entire upper surface 24A of the insulation layer 24. The insulation layer 24 entirely covers the surfaces of the chip capacitor 30 that are not in contact with the adhesive layer 35. As illustrated in FIG. 9B, the insulation layer 24 covers the upper portion of the stepped inner wall surface 22W that defines the opening 22X, the lower portion of the stepped inner wall surface 22W that defines the recess 22Y, and the lower surface 22B of the insulation layer 22 exposed in the recess 22Y. Accordingly, the insulation layer 24 enters the region below the lower surface 22B of the insulation layer 22 exposed by the recess 22Y. As illustrated in FIG. 9C, when the metal layer 70 remains in the recess 22Y between the insulation layers 22 and 24, the insulation layer 24 covers the lower surface 22B of the insulation layer 22 and the side surface of the metal layer 70 that are exposed in the recess 22Y. In this case, the insulation layer 24 in the recess 22Y also extends into the section below the lower surface 22B of the insulation layer 22.

In the step illustrated in FIG. 9A, when forming the insulation layer 24, the upper surface of the wiring layer 13 is flush with the upper surface of each electrode terminal 32 of the chip capacitor 30 or located at a higher position that the upper surface of each electrode terminal 32. This allows the upper surface 24A of the insulation layer 24 to be formed flat. Further, the opening 22X of the insulation layer 22 is tapered so that the width decreases from the upper side toward the lower side as viewed in FIG. 9A. This allows the gap between the insulation layer 22 and the chip capacitor 30 to be efficiently filled with resin and limits the formation of voids in the insulation layer 24.

Figure 9D:
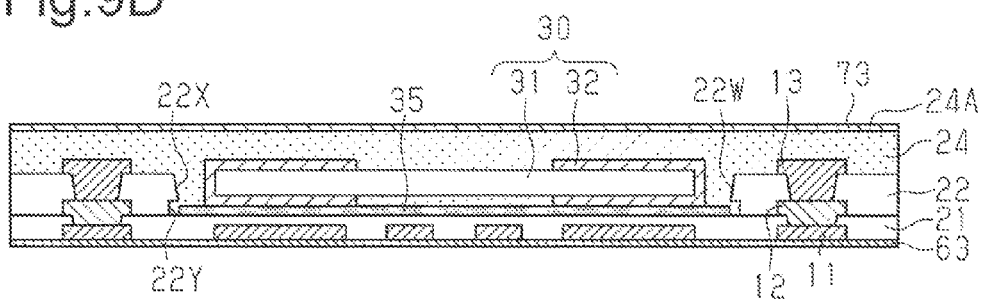

Then, the support 60 and the carrier layer 62 are removed. For example, the carrier layer 62 and the support 60 are mechanically separated from the metal foil 63. The defoliation layer (not illustrated) between the carrier layer 62 and the metal foil 63 weakens the adhesive force between the carrier layer 62 and the metal foil 63. This allows the carrier layer 62 and the support 60 to be easily separated from the metal foil 63. Consequently, as illustrated in FIG. 9D, the lower surface of the metal foil 63 is exposed to the outside.

Figure 9E:
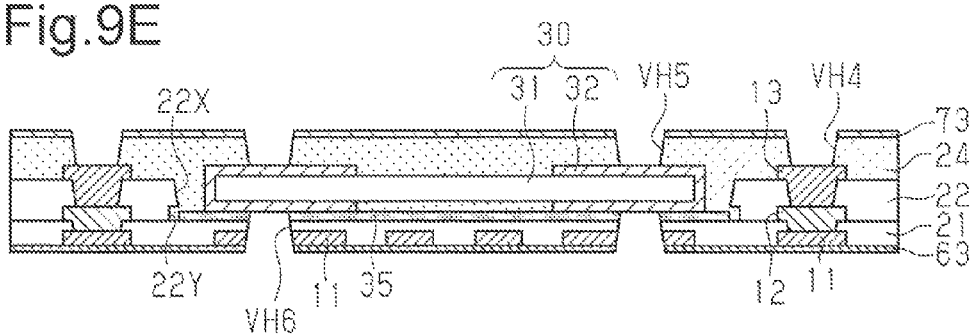

In the step illustrated in FIG. 9E, the through holes VH4 and VH5 are formed in the metal foil 73 and the insulation layer 24 at given locations. Further, the through holes VH6 are formed extending through the metal foil 63, the wiring layer 11, the insulation layer 21, and the adhesive layer 35 in the thickness-wise direction. The through holes VH4 to VH6 may be formed through, for example, laser processing that uses a $CO_2$ laser or a YAG laser.

Figure 10A:
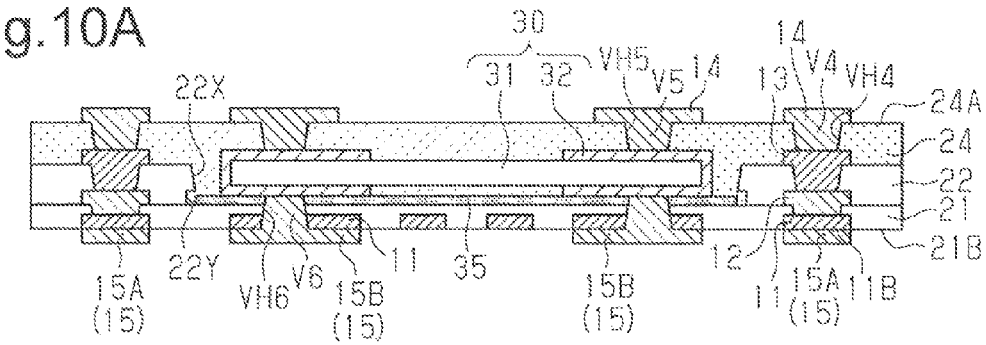
Figure 10B:
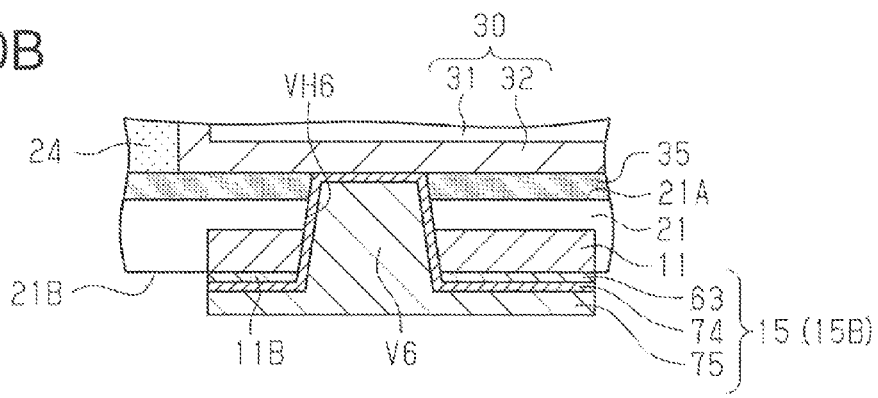

In the step illustrated in FIG. 10A, the through holes VH4 and VH5 are filled with the via wirings V4 and V5, and the through holes VH6 are filled with the via wirings V6 in the same manner as the steps illustrated in FIGS. 5B to 6B. Further, the wiring layer 14 is stacked on the upper surface 24A of the insulation layer 24, and the wiring layer 15 is stacked on the lower surface 11B of the wiring layer 11. The wiring layer 14 includes the first wiring patterns, which are electrically connected to the wiring layer 13 by the via wirings V4, and the second wiring patterns, which are electrically connected to the electrode terminals 32 by the via wirings V5. The wiring layer 15 includes the first wiring patterns 15A, which are directly connected to the wiring patterns of the wiring layer 11 that are electrically connected to the wiring layer 12, and the second wiring patterns 15B, which are electrically connected to the electrode terminals 32 by the via wirings V6. As illustrated in FIG. 10B, the wiring layer 15 includes the metal foil 63, a seed layer 74 that covers the lower surface of the metal foil 63, and an electrolytic copper plating layer 75 that covers the lower surface of the seed layer 74. The seed layer 74 covers the lower and inner surfaces of the metal foil 63; the inner surfaces of the wiring layer 11, the insulation layer 21, and the adhesive layer 35 that define each through hole VH6; and the lower surface of the electrode terminal 32 exposed in each through hole VH6. The through holes VH6 are filled with the electrolytic copper plating layer 75, which covers the lower surface of the seed layer 74. The seed layer 74 may be formed from, for example, copper or a copper alloy.

In this manner, the manufacturing method of the first embodiment forms the wiring layer 15, which electrically connects the chip capacitor 30 and the wiring layer 11, on the surface (lower surface 11B of wiring layer 11) from which the support substrate (support 60 and carrier layer 62 illustrated in FIG. 4A) have been removed.

Figure 10C:
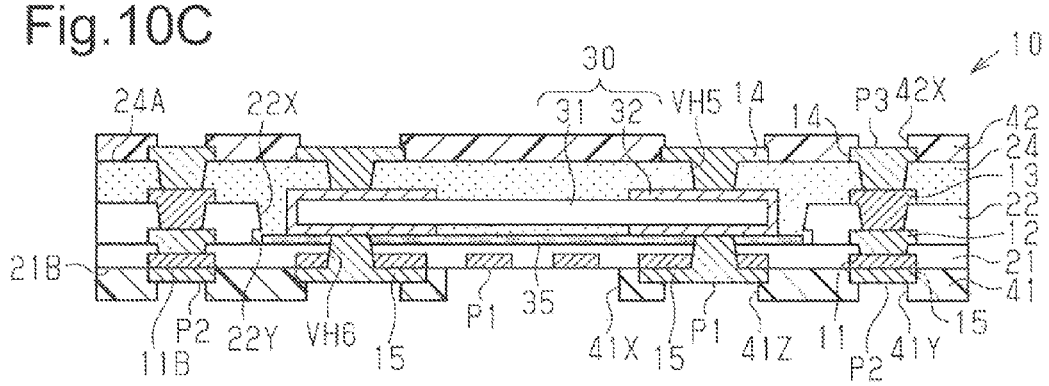

In the step illustrated in FIG. 10C, the solder resist layer 41, which includes the openings 41X, 41Y, and 41Z, is stacked on the lower surface 21B of the insulation layer 21, and the solder resist layer 42, which includes the openings 42X, is stacked on the upper surface 24A of the insulation layer 24. The solder resist layers 41 and 42 may be formed by, for example, laminating a photosensitive solder resist film to a subject surface or applying a solder resist liquid to the subject surface and then patterning the resist into the given shape. The wiring layers 11 and 15 exposed from the openings 41X and 41Z serve as the pads P1, the wiring layer 15 exposed from the openings 41Y serves as the connection pads P2, and the wiring layer 14 exposed from the openings 42X serves as the external connection pads P3. When necessary, for example, a metal layer (surface-processed layer), in which an Ni layer and an Au layer are stacked in this order, may be formed on the pads P1, the connection pads P2, and the external connection pads P3. The metal layer may be formed through, for example, an electroless plating process. The steps described above allow the wiring substrate 10 illustrated in FIG. 1A to be manufactured.

A method for manufacturing the semiconductor device 50 will now be described.

Figure 10D:
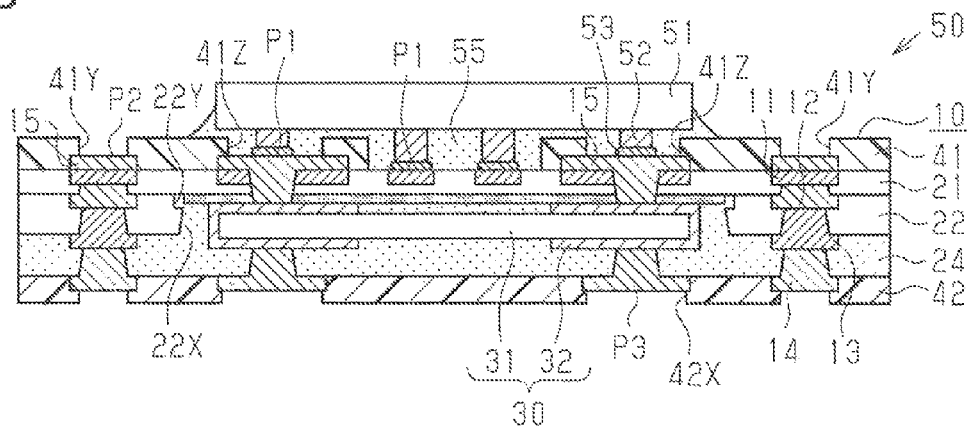
FIG. 10D is a schematic cross-sectional view illustrating a method for manufacturing the semiconductor device of FIG. 3.

In the step illustrated in FIG. 10D, the semiconductor chip 51, which includes the rod-shaped connection terminals 52, is prepared. The connection terminals 52 may be formed through a known method. Thus, the method for forming the connection terminals 52 are not illustrated in the drawings and will not be described in detail. For example, the connection terminals 52 may be formed through the method described below.

A protective film including openings for exposing electrode pads, for example, is formed on the circuit formation surface (here, lower surface) of the semiconductor chip 51. Then, a seed layer is formed covering the lower surface of the protective film and the lower surface of the electrode pads. A resist layer is then formed. The resist layer exposes portions of the seed layer at regions where the connection terminals 52 are formed (seed layer covering lower surfaces of electrode pads). Then, electrolytic plating (e.g., electrolytic copper plating) is performed using the seed layer exposed from the resist layer as a power supplying layer to form the rod-shaped connection terminals 52 on the electrode pads.

The bonding members 53 are then formed on the lower surfaces of the connection terminals 52. For example, electrolytic solder plating is performed, using the resist layer formed on the seed layer as a plating mask and using the seed layer as a plating power supplying layer, to apply solder to the lower surface of the connection terminals and form the bonding members 53. Then, the seed layer and the resist layer that are unnecessary are removed.

Further, the connection terminals 52 of the semiconductor chip 51 are flip-chip-bonded onto the pads P1 of the wiring substrate 10. For example, after positioning the wiring substrate 10 and the semiconductor chip 51, a reflow process is performed to melt the bonding members 53 (solder plating layer) and electrically connect the connection terminals 52 to the pads P1.

Then, the gap between the semiconductor chip 51 and the wiring substrate 10, which are flip-chip-bonded, is filled with the underfill resin 55, which is hardened. The steps described above allow the semiconductor device 50 illustrated in FIG. 3 to be manufactured.

The first embodiment has the advantages described below.

(1) The wiring layer 11 is embedded in the insulation layer 21 (lowermost insulation layer), and the wiring layer 15 that projects downward from the lower surface 21B of the insulation layer 21 is formed on the lower surface 11B of the wiring layer 11. In the same manner as the steps illustrated in FIGS. 5B to 6B, the wiring layer 15 is formed through steps including etching that removes the seed layer 74 and the like. In contrast, etching need not be performed to form the wiring layer 11. Accordingly, the wiring layer 11 may be formed to be finer than the wiring layer 15. The wiring layer 11 allows for a high-density wiring layout.

Further, the formation of the wiring layer 15 on the lower surface 11B of the wiring layer 11 allows, for example, the thickness required for the connection pads P2 to be easily obtained. In the present example, another wiring substrate or another semiconductor device is electrically connected to external connection terminals (solder balls or the like) bonded to the connections pad P2. In this case, the connection pads P1 need to have sufficient thickness taking into account solder leaching caused by the external connection terminals (solder balls or the like) bonded to the connection pads P2. In the first embodiment, the wiring layer 15 is formed in addition to the wiring layer 11. Thus, the wiring layer 15 easily obtains the desired thickness for the connection pads P2. In other words, the wiring layer 15 facilitates the formation of the connection pads P2 on the chip mounting surface.

In this manner, the chip mounting surface includes the wiring layer 11, which allows for easy formation of micro-fabricated wirings, and the wiring layer 15, which allows the desired thickness to be easily obtained. This improves the freedom of design for the wiring layer on the chip mounting surface.

(2) The two wiring layers 11 and 15 allow for the formation of the wiring layer 11 that includes micro-wiring patterns regardless of the thickness of the wiring layer 15. Thus, the wiring layer 11 allows for a high-density wiring layout while obtaining the desired thickness for the pads P2 or the like with the wiring layer 15. This allows wirings to be efficiently laid out in the wiring layers 11 and 15 and allows the wiring substrate 10 to be entirely reduced in size and thickness.

(3) The via wirings V5 in the through holes VH5 connect the wiring layer 14 to the upper surfaces of the electrode terminals 32 of the chip capacitor 30. The via wirings V6 in the through holes VH6 connect the wiring layer 15 to the lower surfaces of the electrode terminals 32. In this manner, via wirings are connected to both upper and lower surfaces of the electrode terminals 32 of the chip capacitor 30 in the coreless wiring substrate 10. This improves the freedom of design for the wiring substrate 10.

(4) The insulation layer 22 includes the stepped inner wall surface 22W that defines the contour of the cavity. In particular, the upper portion of the stepped inner wall surface 22W defines the opening 22X, and the lower portion of the stepped inner wall surface 22W defines the recess 22Y. The recess 22Y has a larger width than the opening 22X. The recess 22Y and the opening 22X are filled with the insulation layer 24, which is stacked on the upper surface 22A of the insulation layer 22. Thus, a portion of the insulation layer 24 (insulation layer 24 in recess 22Y) is included below the lower surface 22B of the insulation layer 22. This produces an anchoring effect that improves the adhesion of the insulation layer 22, which forms the cavity, and the insulation layer 24, with which the cavity is filled, as compared with when the recess 22Y is not formed. Accordingly, even when the wiring substrate 10 warps, separation of the insulation layer 24 from the insulation layer 22 is limited.

(5) The chip capacitor 30 is accommodated in the opening 22X (cavity) that extends through the insulation layer 22 stacked on the upper surface 21A of the insulation layer 21. When, for example, the insulation layer 21 is reduced in thickness to form the cavity, the thickness of the insulation layer 21 between the chip capacitor 30, which is arranged in the cavity, and the wiring layer 11 is reduced. This would lower the reliability of the insulation between the chip capacitor 30 and the wiring layer 11. In this regard, the first embodiment forms the cavity in only the insulation layer 22 without reducing the thickness of the insulation layer 21. Thus, the thickness of the insulation layer 21 is sufficient between the chip capacitor 30 and the wiring layer 11. This improves the reliability of the insulation between the chip capacitor 30 and the wiring layer 11.

(6) The adhesive layer 35 and the wiring layer 12 lie along the same plane. Thus, the wiring substrate 10 is entirely reduced in thickness as compared with when the adhesive layer 35 is located upward from the wiring layer 12. Further, a large distance is obtained between the chip capacitor 30 and the wiring layer 11 as compared with when, for example, the adhesive layer 35 is located downward from the wiring layer 12. This improves the reliability of the insulation between the chip capacitor 30 and the wiring layer 11.

(7) The metal layer 70 is formed on the upper surface 21A of the insulation layer 21, and the insulation layer 22 is formed entirely covering the metal layer 70. Then, laser processing is performed to form the opening 22X, which is smaller than the metal layer 70, in the insulation layer 22. In this manner, the metal layer 70 exists when the opening 22X is formed. This limits reduction in the thickness of the insulation layer 21 during laser processing. Further, subsequent to the formation of the opening 22X, isotropic etching is performed to remove the metal layer 70 that is larger than the opening 22X. This facilitates the formation of the recess 22Y in the bottom portion of the opening 22X.

(8) The opening 22X of the insulation layer 22 is tapered and has a width that decreases from the upper surface 22A toward the insulation layer 21. This improves the efficiency for filling the gap between the insulation layer 22 and the chip capacitor 30 with resin when forming the insulation layer 24 in the opening 22X. Thus, the formation of voids in the insulation layer 24 is limited.

(9) The wiring substrate 10 is a coreless wiring substrate. This reduces the thickness of the entire wiring substrate 10 as compared with a build-up wiring substrate including a core substrate.

Second Embodiment

A second embodiment will now be described with reference to FIGS. 11A to 13C. In the second embodiment, a wiring substrate 10A differs from the wiring substrate 10 of the first embodiment in the structure of the wiring layers 11 and 15. The description hereafter will focus on differences from the first embodiment. Same reference numerals are given to those components that are the same as the corresponding components illustrated in FIGS. 1A to 10D. Such components will not be described in detail.

As illustrated in FIG. 11A, the wiring layer 15 of the wiring substrate 10A projects downward from the lower surface 21B of the insulation layer 21 in the same manner as the first embodiment. In the present example, the wiring layer 15 is stacked on the lower surface 21B of the insulation layer 21.

The wiring layer 15 includes second wiring patterns 15B that are electrically connected to the electrode terminals 32 of the chip capacitor 30 by the via wirings V6 in the through holes VH6, which extend through the insulation layer 21. In the present example, wiring patterns of the wiring layer 11 are not formed immediately above the second wiring patterns 15B, which are formed at locations overlapped with the through holes VH6 in a plan view. Thus, the through holes VH6 extend through the insulation layer 21 and the adhesive layer 35 in the thickness-wise direction and partially expose the lower surfaces of the electrode terminals 32.

The wiring layer 15 includes third wiring patterns 15C that are electrically connected to the wiring layer 12 by via wirings V7 in through holes VH7 extending through the insulation layer 21. The through holes VH7 extend through the insulation layer 21 from the upper surface 21A of the insulation layer 21 (lower surface of wiring layer 12) to the lower surface 21B of the insulation layer 21 (upper surface of wiring layer 15) in the thickness-wise direction. Each through hole VH7 is, for example, tapered so that the diameter decreases from the lower side toward the upper side as viewed in FIG. 11A. More specifically, each through hole VH7 includes an upper opening end, which is closer to the wiring layer 12, and a lower opening end, which is closer to the wiring layer 15 (third wiring pattern 15C). The upper opening end is smaller than the lower opening end. The via wirings V7 in the through holes VH7 electrically connect the third wiring patterns 15C to the wiring layer 12.

As illustrated in FIG. 11B, the wiring layer 15 includes wiring patterns 15D that are electrically connected to the wiring layer 11. For example, each wiring pattern 15D is directly stacked on the lower surface 11B of the wiring layer 11 so that only a portion of the wiring pattern 15D is directly connected to an end of the wiring layer 11.

As illustrated in FIG. 11A, the solder resist layer 41 includes the opening 41X that exposes the wiring layer 11 as the pads P1, the openings 41Z that expose the wiring layer 15 (e.g., second wiring patterns 15B) as the pads P1, and the openings 41Y that expose the wiring layer 15 (e.g., wiring patterns 15C) as the connection pads P2.

In the second embodiment, the insulation layer 21 is one example of a first insulation layer, the insulation layer 22 is one example of a second insulation layer, and the insulation layer 24 is one example of a third insulation layer. Further, the wiring layer 11 is one example of a first wiring layer, the wiring layer 15 is one example of a second wiring layer, the wiring layer 12 is one example of a third wiring layer, the wiring layer 13 is one example of a fourth wiring layer, and the wiring layer 14 is one example of a fifth wiring layer. Further, each through hole VH2 is one example of a first through hole, each through hole VH7 is one example of a second through hole, each through hole VH5 is one example of a fifth through hole, and each through hole VH6 is one example of a sixth through hole. Further, each via wiring V2 is one example of a first via wiring, each via wiring V7 is one example of a second via wiring, each via wiring V5 is one example of a fifth via wiring, and each via wiring V6 is one example of a sixth via wiring.

A method for manufacturing the wiring substrate 10A will now be described. To aid understanding, components that ultimately function as the elements of the wiring substrate 10A are denoted by the reference characters added to such elements.

Figure 12A:
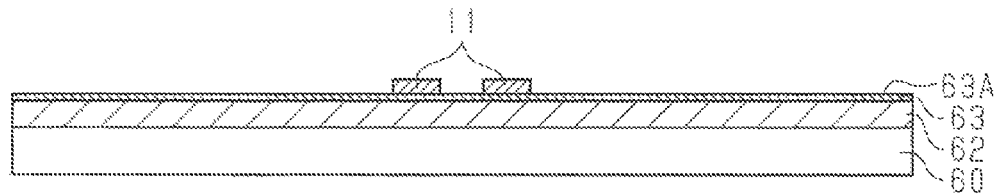
FIGS. 12A to 12D and 13A to 13C are schematic cross-sectional views illustrating a method for manufacturing the wiring substrate of FIG. 11A.

The steps illustrated in FIGS. 4A and 4B are performed to manufacture the structure illustrated in FIG. 12A. Here, the wiring layer 11 is formed on only the region corresponding to the mounting region corresponding to the mounting region of the semiconductor chip 51 (refer to FIG. 3).

Figure 12B:
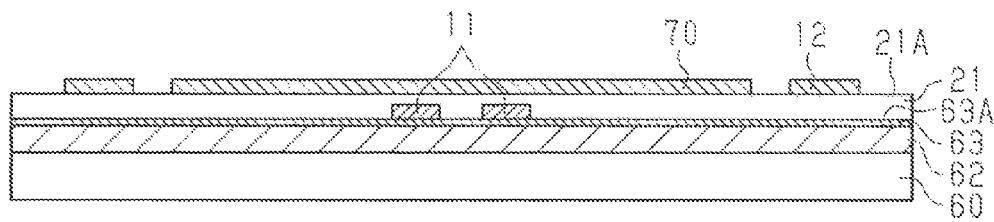

In the step illustrated in FIG. 12B, in the same manner as the steps illustrated in FIGS. 4C to 6B, the insulation layer 21 is formed on the upper surface 63A of the metal foil 63, and the wiring layer 12 and the metal layer 70 are formed on the upper surface 21A of the insulation layer 21.

Figure 12C:
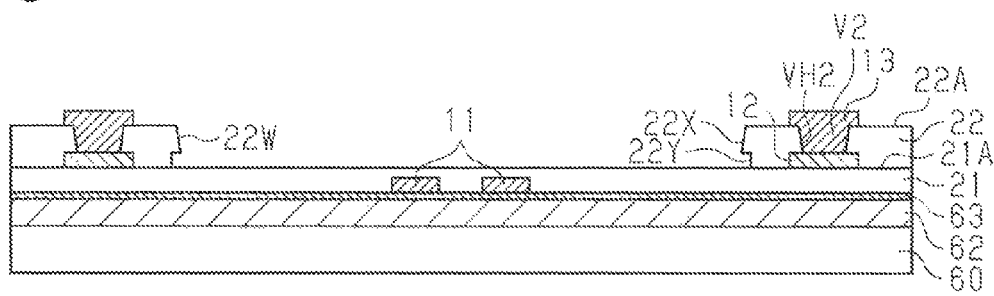

In the step illustrated in FIG. 12C, in the same manner as the steps illustrated in FIGS. 6D to 8A, the insulation layer 22 is formed on the upper surface 21A of the insulation layer 21. Further, the wiring layer 13 is formed on the upper surface 22A of the insulation layer 22 after forming the opening 22X and the recess 22Y in the insulation layer 22.

Figure 12D:
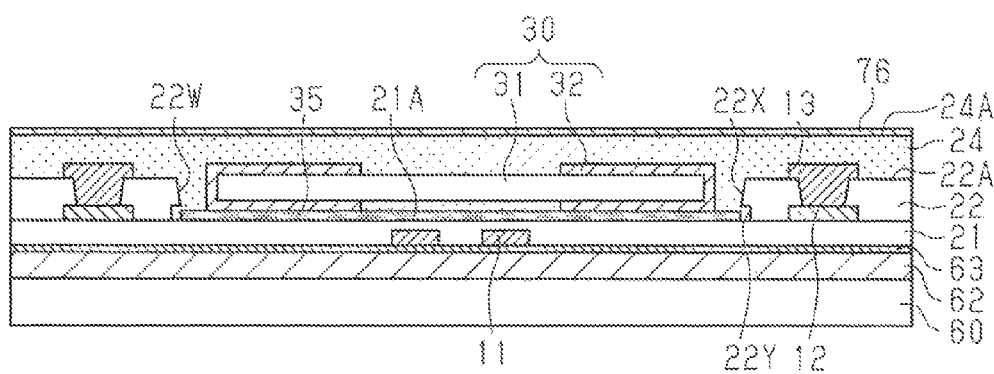

In the step illustrated in FIG. 12D, the chip capacitor 30 is mounted on the upper surface 21A of the insulation layer 21 that is exposed in the opening 22X with the adhesive layer 35 arranged in between in the same manner as the steps illustrated in FIGS. 8B and 8C. Then, in the same manner as the step illustrated in FIG. 9A, the insulation layer 24, which covers the wiring layer 13 and the chip capacitor 30, and the metal foil 76, which entirely covers the upper surface 24A of the insulation layer 24, are sequentially stacked. Here, the opening 22X is filled with the insulation layer 24.

Then, the support 60 and the carrier layer 62 are removed to expose the lower surface of the metal foil 63 to the outside. In the step illustrated in FIG. 13A, the through holes VH4 and VH5 are formed extending through the metal foil 76 and the insulation layer 24 in the thickness-wise direction. Further, the through holes VH6 are formed extending through the metal foil 63, the insulation layer 21, and the adhesive layer 35 in the thickness-wise direction. The through holes VH7 are formed extending through the metal foil 63 and the insulation layer 21 in the thickness-wise direction.

Figure 13A:
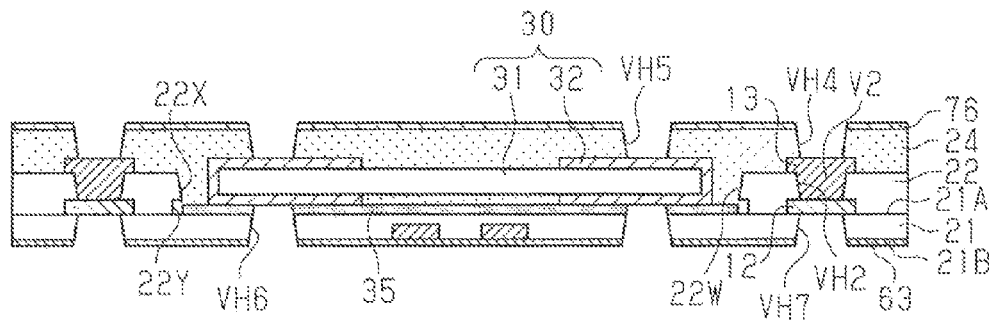
Figure 13B:
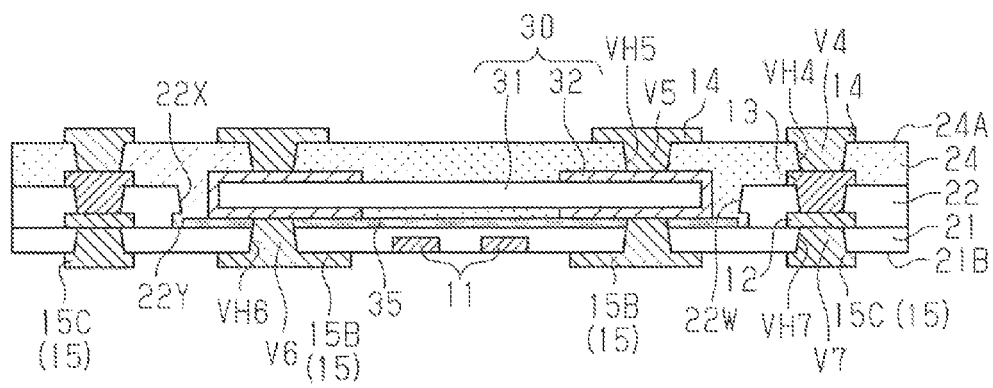

In the step illustrated in FIG. 13B, the through holes VH4 and VH5 are respectively filled with the via wirings V4 and V5, and the through holes VH6 and VH7 are respectively filled with the via wirings V6 and V7 in the same manner as the step illustrated in FIG. 10A. Further, the wiring layer 14 is stacked on the upper surface 24A of the insulation layer 24, and the wiring layer 15 is stacked on the lower surface 21B of the insulation layer 21. The wiring layer 14 includes the first wiring patterns, which are electrically connected to the wiring layer 13 by the via wirings V4, and the second wiring patterns, which are electrically connected to the electrode terminals 32 by the via wirings V5. The wiring layer 15 includes the second wiring pattern 15B, which are electrically connected to the electrode terminal 32 by the via wirings V6, and the third wiring patterns 15C, which are electrically connected to the wiring layer 12 by the via wirings V7.

Figure 13C:
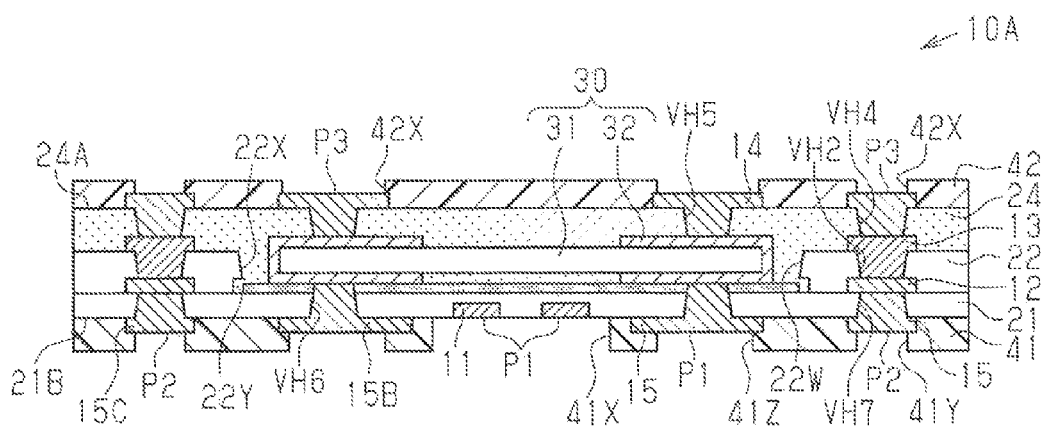

In the step illustrated in FIG. 13C, in the same manner as the step illustrated in FIG. 10C, the solder resist layer 41, which includes the openings 41X, 41Y, and 41Z, is stacked on the lower surface 21B of the insulation layer 21. Further, the solder resist layer 42, which includes the opening 42X, is stacked on the upper surface 24A of the insulation layer 24.

The steps described above allow the wiring substrate 10A of the second embodiment to be manufactured.

The second embodiment has the same advantages as the first embodiment.

Third Embodiment

A third embodiment will now be described with reference to FIGS. 14 to 17C. A wiring substrate 10B of the third embodiment differs from the wiring substrate 10 of the first embodiment in the wiring structure stacked on the upper surface 22A of the insulation layer 22. The description hereafter will focus on differences from the first embodiment. Same reference numerals are given to those components that are the same as the corresponding components illustrated in FIGS. 1A to 13C. Such components will not be described in detail.

Figure 14:
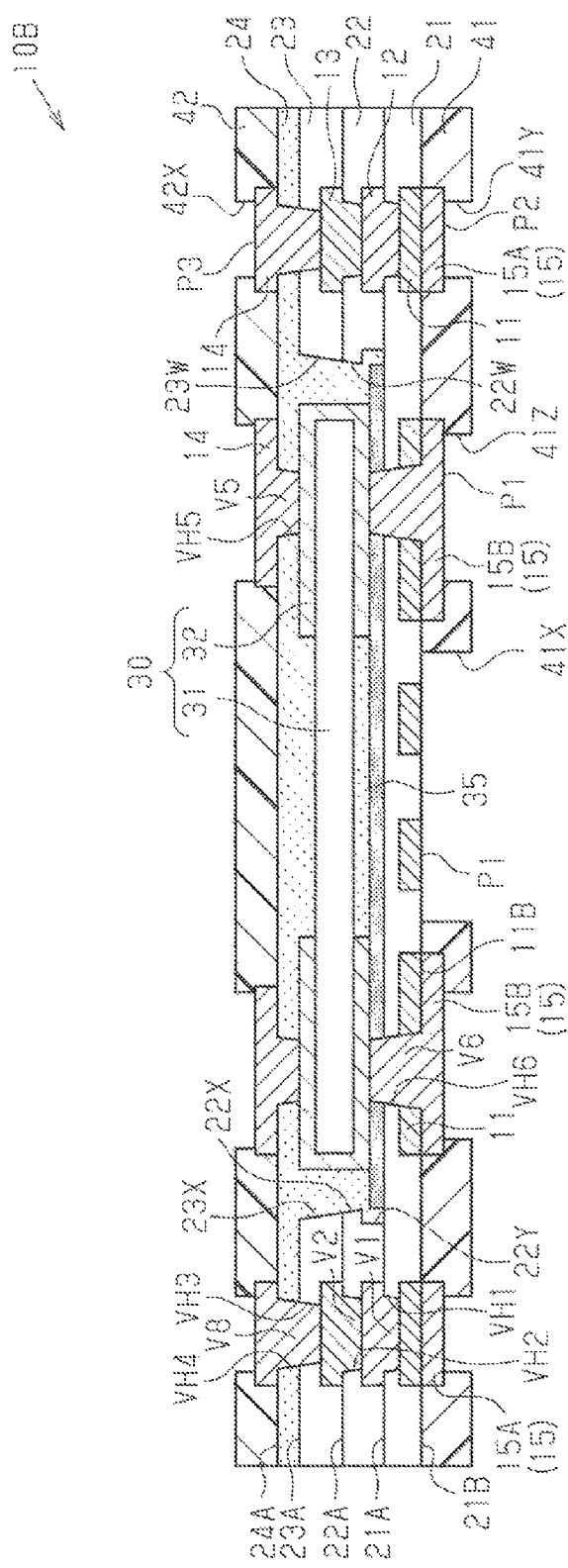
FIG. 14 is a schematic cross-sectional view illustrating a third embodiment of a wiring substrate.

As illustrated in FIG. 14, the wiring substrate 10B has a structure obtained by sequentially stacking the wiring layer 15, the wiring layer 11, the insulation layer 21, the wiring layer 12, the insulation layer 22, the wiring layer 13, an insulation layer 23, the insulation layer 24, and the wiring layer 14. Further, the wiring substrate 10B includes the chip capacitor 30 incorporated in the insulation layers 21 to 24, the solder resist layer 41, and the solder resist layer 42.

The insulation layer 22 is formed on the upper surface 21A of the insulation layer 21 to cover the wiring layer 12. The upper surface 22A of the insulation layer 22 is located at a lower position than the upper surfaces of the electrode terminals 32 of the chip capacitor 30, which is incorporated in the insulation layers 21 to 24. The thickness of the insulation layer 22 measured from the upper surface of the wiring layer 12 to the upper surface 22A of the insulation layer 22 may be, for example, 30 to 60 μm.

The insulation layer 22 includes the through holes VH2, which extend through the insulation layer 22 in the thickness-wise direction and partially exposes the upper surface of the wiring layer 12, and the opening 22X, which extends through the insulation layer 22 in the thickness-wise direction and partially exposes the upper surface 21A of the insulation layer 21.

The wiring layer 13 is stacked on the upper surface 22A of the insulation layer 22. The wiring layer 13 is electrically connected to the wiring layer 12 by the via wirings V2 with which the through holes VH2 are filled. The wiring layer 13 is formed integrally with, for example, the via wirings V2. The wiring layer 13 may have a thickness of, for example, 10 to 20 μm.

The insulation layer 23 is formed on the upper surface 22A of the insulation layer 22 to cover the wiring layer 13. There is no wiring layer formed on the upper surface 23A of the insulation layer 23. The insulation layer 23 may be formed from the same material as the insulation layers 21, 22, and 24. The thickness of the insulation layer 23 measured from the upper surface of the wiring layer 13 to the upper surface 23A of the insulation layer 23 may be, for example, 15 to 45 μm.

Through holes VH2 extend through the insulation layer 22 in the thickness-wise direction at given locations and partially expose the upper surface of the wiring layer 12. Each through hole VH2 is, for example, tapered so that the diameter decreases, as viewed in FIG. 1A, from the upper side toward the lower side.

Through holes VH3 extend through the insulation layer 23 in the thickness-wise direction at given locations and partially expose the upper surface of the wiring layer 13.

Each through hole VH3 is, for example, tapered so that the diameter decreases, as viewed in FIG. 14, from the upper side toward the lower side.

Further, an opening 23X extends through the insulation layer 23 in the thickness-wise direction at a given location and partially exposes the upper surface 21A of the insulation layer 21. The opening 23X has a size corresponding to the chip capacitor 30 incorporated in the insulation layers 21 to 24. That is, the opening 23X is located at the position where the chip capacitor 30 is mounted. In the third embodiment, the region surrounded by the stepped inner wall surface 22W of the insulation layer 22 that defines the opening 22X and the recess 22Y, an inner wall surface 23W of the insulation layer 23 that defines the opening 23X, and the upper surface 21A of the insulation layer 21 defines a cavity that accommodates the chip capacitor 30. In this manner, in the wiring substrate 10B, the insulation layers 22 and 23, which are stacked on the upper surface 21A of the insulation layer 21 (lowermost insulation layer), serve as a cavity formation insulation layer, and the wiring layers 12 and 13 are incorporated in the insulation layers 22 and 23.

The opening 23X and the opening 22X are in communication with each other. In the present example, the stepped inner wall surface 22W of the insulation layer 22 is continuous with the inner wall surface 23W of the insulation layer 23. Thus, the opening 23X has a shape (tetragonal) and size that are substantially the same as the opening 22X.

The openings 22X and 23X are, for example, each tapered so that the width decreases from the upper side toward the lower side as viewed in FIG. 14. That is, the openings 22X and 23X each have a lower opening end, which is located closer to the insulation layer 21, and an upper opening end, which is located closer to the upper surface 23A of the insulation layer 23. The lower opening end has a smaller width than the upper opening end.

The chip capacitor 30 is mounted on the upper surface 21A of the insulation layer 21 that is exposed in the openings 22X and 23X with the adhesive layer 35 arranged in between. Accordingly, the chip capacitor 30 is arranged in the openings 22X and 23X, that is, the cavity. In the present example, when the chip capacitor 30 is arranged in the openings 22X and 23X, the upper surfaces of the electrode terminals 32 of the chip capacitor 30 lie along the same plane as the upper surface 23A of the insulation layer 23A or along a plane located at a lower position than the upper surface 23A.

The insulation layer 24 is formed on the upper surface 23A of the insulation layer 23. The insulation layer 24 entirely covers the upper surface 23A of the insulation layer 23 and entirely covers the chip capacitor 30. The openings 23X and 22X and the recess 22Y are filled with the insulation layer 24. In the openings 22X and 23X and the recess 22Y, the insulation layer 24 covers the upper surface 21A of the insulation layer 21 exposed from the adhesive layer 35, the inner wall surface 23W of the insulation layer 23 that defines the opening 23X, and the stepped inner wall surface 22W of the insulation layer 22 that defines the opening 22X and the recess 22Y. The thickness of the insulation layer 24 measured from the upper surface 23A of the insulation layer 23 to the upper surface 24A of the insulation layer 24 may be, for example, approximately 15 to 45 µm.

Through holes VH4 extend through the insulation layer 24 in the thickness-wise direction at given locations and partially expose the upper surface of the wiring layer 13. The through holes VH4 are continuous with the through holes VH3 of the insulation layer 23. For example, the inner wall surface of the insulation layer 23 that defines each through hole VH3 is continuous with the inner wall surface of the insulation layer 24 that defines the corresponding through hole VH4. The through holes VH3 and VH4 are, for example, each tapered so that the diameter decreases, as viewed in FIG. 14, from the upper side toward the lower side.

In this manner, the two insulation layers 23 and 24 are formed between the wiring layer 13, which is incorporated in the cavity formation insulation layers 22 and 23, and the wiring layer 14. Via wirings V8, which extend through the two insulation layers 23 and 24 in the thickness-wise direction, electrically connect the wiring layers 13 and 14.

In the third embodiment, the insulation layer 21 is one example of a first insulation layer, the insulation layer 22 is one example of a second insulation layer, and the insulation layer 24 is one example of a third insulation layer. Further, the wiring layer 11 is one example of a first wiring layer, the wiring layer 15 is one example of a second wiring layer, the wiring layer 12 is one example of a third wiring layer, the wiring layer 13 is one example of a fourth wiring layer, and the wiring layer 14 is one example of a fifth wiring layer. Further, each through hole VH2 is one example of a first through hole, each through hole VH1 is one example of a third through hole, each through hole VH5 is one example of a fifth through hole, and each through hole VH6 is one example of a sixth through hole. Further, each via wiring V2 is one example of a first via wiring, each via wiring V1 is one example of a third via wiring, each via wiring V5 is one example of a fifth via wiring, and each via wiring V6 is one example of a sixth via wiring.

A method for manufacturing the wiring substrate 10B will now be described. To aid understanding, components that ultimately function as the elements of the wiring substrate 10B are denoted by the reference characters added to such elements.

Figure 15A:
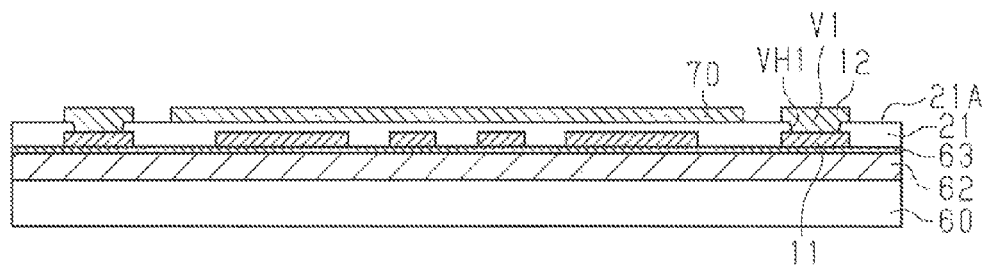
FIGS. 15A to 15D, 16A to 16C, and 17A to 17C are schematic cross-sectional views illustrating a method for manufacturing the wiring substrate of FIG. 14.

First, the same steps as the steps illustrated in FIGS. 6A to 6B are performed to manufacture the structure illustrated in FIG. 15A.

Figure 15B:
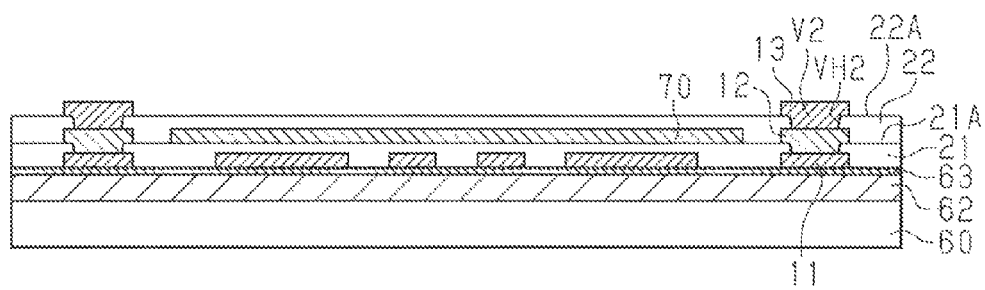

In the step illustrated in FIG. 15B, the insulation layer 22, which covers the wiring layer 12 and the metal layer 70, is formed on the upper surface 21A of the insulation layer 21, and the through holes VH2 are formed in the insulation layer 22, in the same manner as the steps illustrated in FIGS. 4C and 5A. Then, the via holes VH2 are filled with the via wirings V2 in the same manner as the steps illustrated in FIGS. 5B to 6B. Further, the wiring layer 13, which is electrically connected to the wiring layer 12 by the via wirings V2, is stacked on the upper surface 22A of the insulation layer 22.

Figure 15C:
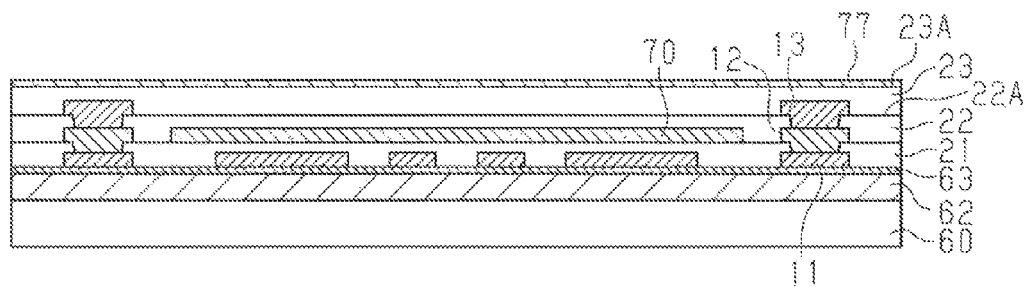
Figure 15D:
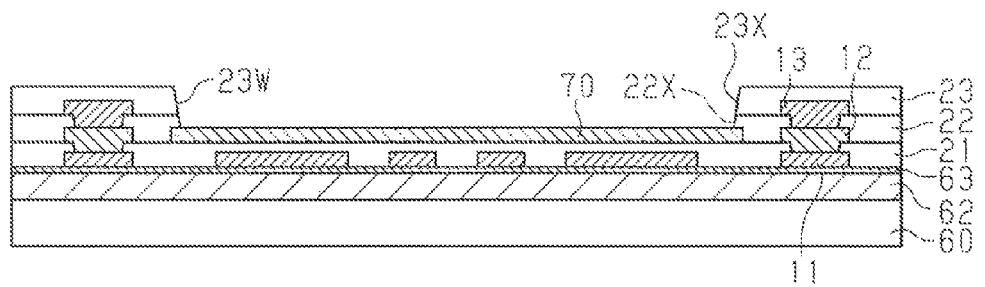

Then, in the step illustrated in FIG. 15C, in the same manner as the steps illustrated in FIGS. 4C and 4D, the insulation layer 23, which covers the upper surface 22A of the insulation layer 22 and entirely covers the wiring layer 13, is stacked on the upper surface 22A of the insulation layer 22. Further, the upper surface 23A of the insulation layer 23 is entirely covered by a metal foil 77.

Subsequently, etching is performed to remove the metal foil 77. In the step illustrated in FIG. 15D, the opening 23X, which extends through the insulation layer 23, and the opening 22X, which extends through the insulation layer 22 and is in communication with the opening 23X, are formed to expose the metal layer 70 at portions corresponding to the mounting region of the chip capacitor 30 (refer to FIG. 14). The opening 22X is smaller than the metal layer 70 in a plan view. Thus, the peripheral portion of the metal layer 70 is covered by the insulation layer 22. The openings 22X and 23X may be formed through laser processing that uses a $CO_2$ laser or a YAG laser. In such a case, the metal layer 70 functions as a stopper layer during laser processing. This limits damages, which would be caused by excessive laser processing, to the insulation layer 21 that is located under the insulation layer 22.

The metal foil 77 (refer to FIG. 15C) may be used as a conformal mask to form the openings 22X and 23X. For example, the metal foil 77 is etched and patterned to form an opening (not illustrated) having the same shape in a plan view as the openings 22X and 23X. Then, laser processing is performed on the insulation layers 22 and 23 exposed in the opening of the metal foil 77 to form the openings 22X and 23X in the insulation layers 22 and 23. Further, etching is performed to remove the metal foil 77. In this case, the metal foil 77, which is patterned during the etching, functions as a mask during laser processing. This allows the openings 22X and 23X to be accurately formed with the desired shape. Further, the metal layer 70 also functions as a stopper layer during laser processing in this case.

When the insulation layers 22 and 23 are formed from a photosensitive resin, a photolithography process may be performed to form the openings 22X and 23X.

Figure 16A:
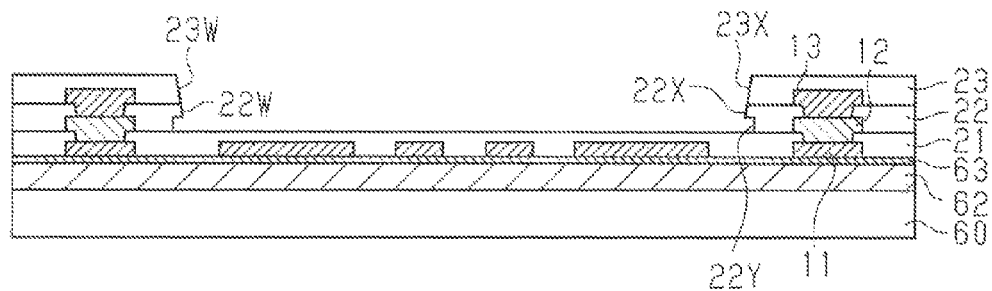

Then, in the same manner as the step illustrated in FIG. 7B, isotropic etching is performed using the insulation layers 22 and 23 as an etching mask to remove the metal layer 70. As illustrated in FIG. 16A, this forms the recess 22Y below the opening 22X with the lower portion of the stepped inner wall surface 22W of the insulation layer 22.

Figure 16B:
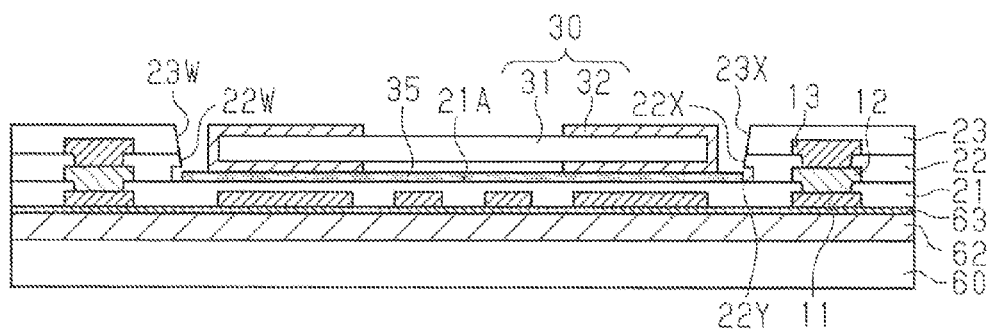

In the step illustrated in FIG. 16B, the chip capacitor 30 is mounted on the upper surface 21A of the insulation layer 21 that is exposed from the openings 22X and 23X with the adhesive layer 35 arranged in between in the same manner as the steps illustrated in FIGS. 8B and 8C.

Figure 16C:
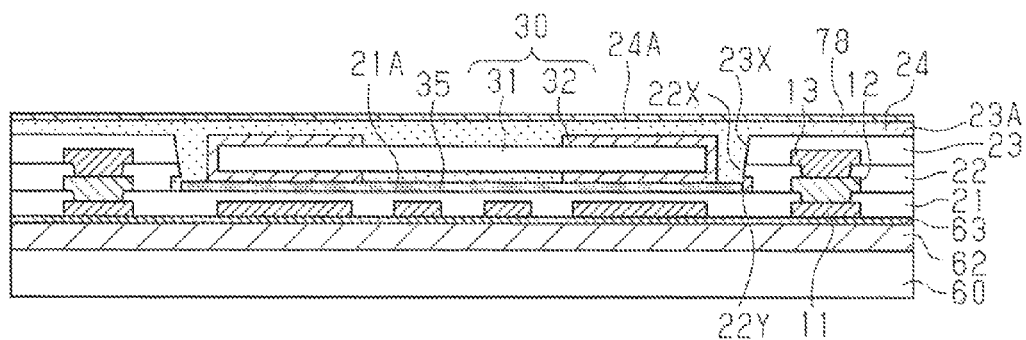

In the step illustrated in FIG. 16C, the insulation layer 24, which entirely covers the upper surface 23A of the insulation layer 23 and with which the openings 22X and 23X and the recess 22Y are filled, and a metal foil 78, which entirely covers the upper surface 24A of the insulation layer 24, are sequentially stacked in the same manner as the steps illustrated in FIGS. 4C and 4D. The insulation layer 24 entirely covers the surfaces of the chip capacitor 30 that are not in contact with the adhesive layer 35. The upper surface 23A of the insulation layer 23 lies along the same plane as the upper surface of each electrode terminal 32 of the chip capacitor 30 or is located at a higher position than the upper surface of each electrode terminal 32. This allows the upper surface 24A of the insulation layer 24 to be formed flat.

Then, the support 60 and the carrier layer 62 are removed. This exposes the lower surface of the metal foil 63 to the outside. In the step illustrated in FIG. 17A, laser processing is performed to form the through holes VH4 and VH5, which extend through the metal foil 78 and the insulation layer 24, and the through holes VH3, which extend through the insulation layer 23 and are in communication with the through holes VH4. Further, laser processing is performed to form the through holes VH6 at given locations in the metal foil 63, the wiring layer 11, the insulation layer 21, and the adhesive layer 35.

Figure 17A:
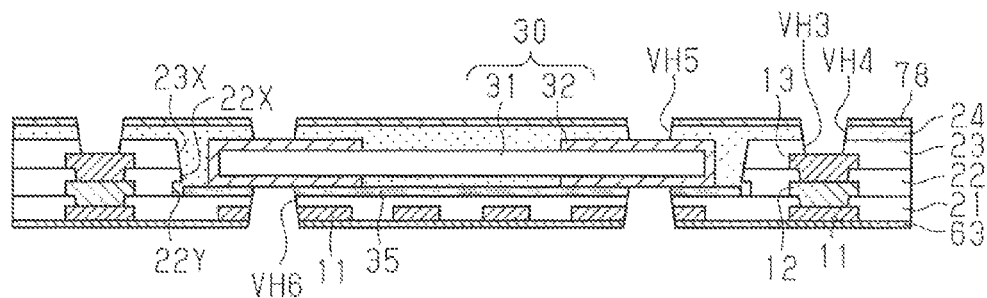
Figure 17B:
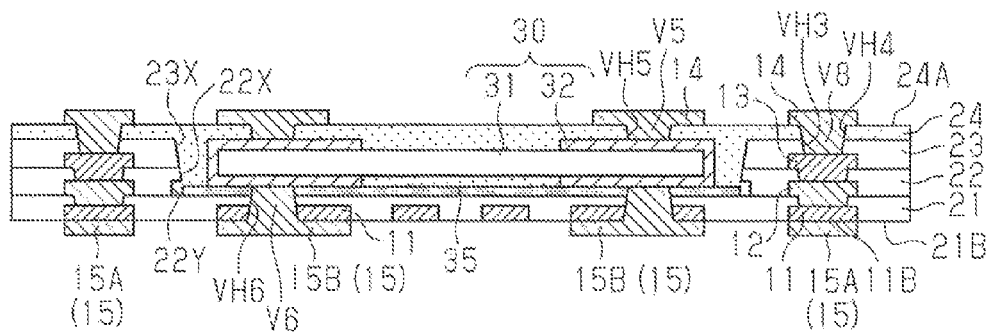

In the step illustrated in FIG. 17B, the through holes VH3 and VH4 are filled with the via wirings V8, the through holes VH5 are filled with the via wirings V5, and the through holes VH6 are filled with the via wirings V6. Further, the wiring layer 14 is stacked on the upper surface 24A of the insulation layer 24, and the wiring layer 15 is stacked on the lower surface 11B of the wiring layer 11. The wiring layer 14 includes the first wiring patterns, which are connected to the wiring layer 13 by the via wirings V8, and the second wiring patterns, which are electrically connected to the electrode terminals 32 by the via wirings V5. Further, the wiring layer 15 includes the first wiring patterns 15A, which are directly connected to the wiring patterns of the wiring layer 11 electrically connected to the wiring layer 12, and the second wiring patterns 15B, which are electrically connected to the electrode terminals 32 by the via wirings V6.

Figure 17C:
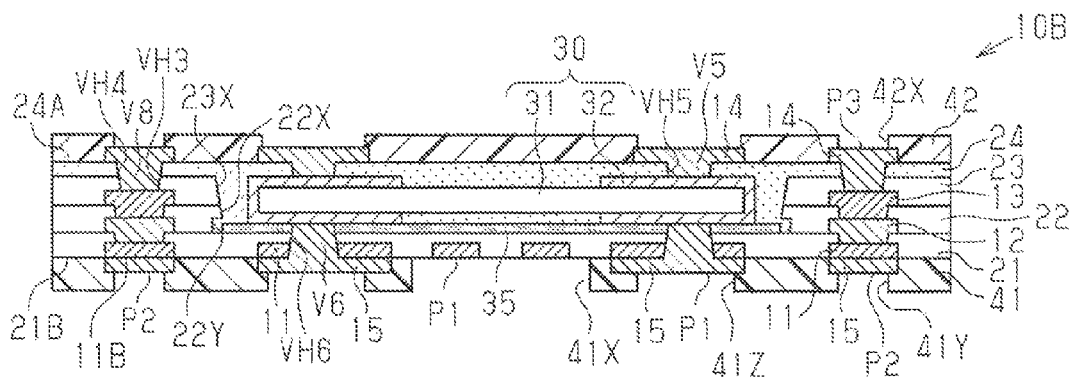

In the step illustrated in FIG. 17C, the solder resist layer 41 is stacked on the lower surface 21B of the insulation layer 21, and the solder resist layer 42 is stacked on the upper surface 24A of the insulation layer 24, in the same manner as the step illustrated in FIG. 10C. The steps described above allow the wiring substrate 10B of the third embodiment to be manufactured.

The third embodiment has the advantages described below in addition to advantages (1) to (9) of the first embodiment.

(10) The two insulation layers 22 and 23 stacked on the insulation layer 21 serve as cavity formation insulation layers. Further, the wiring layer 13 is incorporated in the insulation layers 22 and 23. The upper surface 23A of the insulation layer 23 is free from wiring layers, and the insulation layer 24, with which the cavity is filled, is formed on the upper surface 23A of the insulation layer 23. Further, the wiring layer 14 is formed on the upper surface 24A of the insulation layer 24 and electrically connected to the wiring layer 13 by the via wirings V8, which extend through the insulation layers 23 and 24 in the thickness-wise direction. This limits differences in the thickness of the insulation layers 21 to 24 and allows the wiring substrate 10B to be entirely reduced in thickness.

(11-1) The reason differences in the thickness of the insulation layers 21 to 24 are limited in advantage (10) will now be described together with the configuration of comparative example 1. In the configuration of comparative example 1 that includes, for example, only one insulation layer (e.g., insulation layer 22) as the cavity formation insulation layer, the thickness of the single insulation layer is affected and restricted by the thickness of the chip capacitor 30. In contrast, the configuration of the third embodiment includes the two insulation layers 22 and 23 that serve as the cavity formation insulation layer, and the total thickness of the insulation layers 22 and 23 is affected by the thickness of the chip capacitor 30. However, the thickness of each of the insulation layers 22 and 23 may be set regardless of the thickness of the chip capacitor 30.

For example, the thickness of the chip capacitor 30 may be set to 100 μm, the depth of the cavity may be set to 105 μm, the thickness of each of the wiring layers 11 to 13 may be set to 15 μm, and the minimum thickness of each of the insulation layers 21 to 24 may be set to 25 μm. In this case, the thickness of the insulation layer 21 measured from the upper surface 11A of the wiring layer 11 to the upper surface 21A of the insulation layer 21 may be set to 25 μm in the third embodiment and comparative example 1. In comparative example 1, the cavity is formed by only the single insulation layer 22. Thus, when the thickness of the wiring layer 12 is 15 μm, the thickness of the insulation layer 22 measured from the upper surface of the wiring layer 12 to the upper surface 22A of the insulation layer 22 needs to be set to 90 μm. In comparative example 1, the thickness of the insulation layer 24 measured from the upper surface of the wiring layer 13 to the upper surface 24A of the insulation layer 24 may be set to 25 μm. Accordingly, in comparative example 1, the thickness of the insulation layer 22 is greater than or equal to three times the thickness of each of the insulation layers 21 and 24. This decreases the diameter of the lower opening end of each through hole VH2 that extends through the insulation layer 22 and exposes the upper surface of the wiring layer 12. Thus, the reliability of the connection between the wiring layer 12 and the wiring layer 13 may be lowered.

In contrast, in the third embodiment, the total thickness of the wiring layers 12 and 13 incorporated in the insulation layers 22 and 23 is 30 μm. Thus, for example, when the thickness of the insulation layer 23 measured from the upper surface of the wiring layer 13 to the upper surface 23A of the insulation layer 23 is set to 25 μm, the thickness of the insulation layer 22 measured from the upper surface of the wiring layer 12 to the upper surface 22A of the insulation layer 22 may be set to 50 μm. Further, the thickness of the insulation layer 24 may be set to 25 μm. Thus, the total thickness of the insulation layers 23 and 24 may be set to 50 μm. Accordingly, the thickness of the insulation layer 22 in the third embodiment may be limited to approximately two times the thickness of the insulation layer 21. Further, the total thickness of the insulation layer 23 and 24 may also be limited to approximately two times the thickness of the insulation layer 21. Thus, differences in the thickness of the insulation layers 21 to 24 may be reduced. As a result, situations are limited in which the diameter of the lower opening end of each of the through holes VH2, VH3, and VH4 is decreased. Accordingly, the connection reliability is maintained between the wiring layer 12 and the wiring layer 13 and between the wiring layer 13 and the wiring layer 14.

(11-2) The reason the wiring substrate 10A is entirely reduced in thickness in advantage (10) will now be described together with the configuration of comparative example 2. The configuration of comparative example 2 includes, for example, a further wiring layer that is electrically connected to the wiring layer 13 and formed on the upper surface 23A of the insulation layer 23 in the wiring substrate 10B. In this configuration, the insulation layer 24 needs to cover the further wiring layer. Thus, the formation of the further wiring layer on the upper surface 23A of the insulation layer 23 increases the thickness of the entire wiring substrate. In contrast, the third embodiment forms the wiring layer 14, which is electrically connected to the wiring layer 13, on the upper surface 24A of the insulation layer 24 without forming a further wiring layer on the upper surface 23A of the insulation layer 23. Thus, the entire wiring substrate 10A is thinner than comparative example 2 since the further wiring layer is omitted.

Fourth Embodiment

A fourth embodiment will now be described with reference to FIGS. 18 to 21C. A wiring substrate 10C of the fourth embodiment differs from the wiring substrate 10B of the third embodiment in the number of stacked wiring layers. The description hereafter will focus on differences from the third embodiment. Same reference numerals are given to those components that are the same as the corresponding components illustrated in FIGS. 1A to 17C. Such components will not be described in detail.

Figure 18:
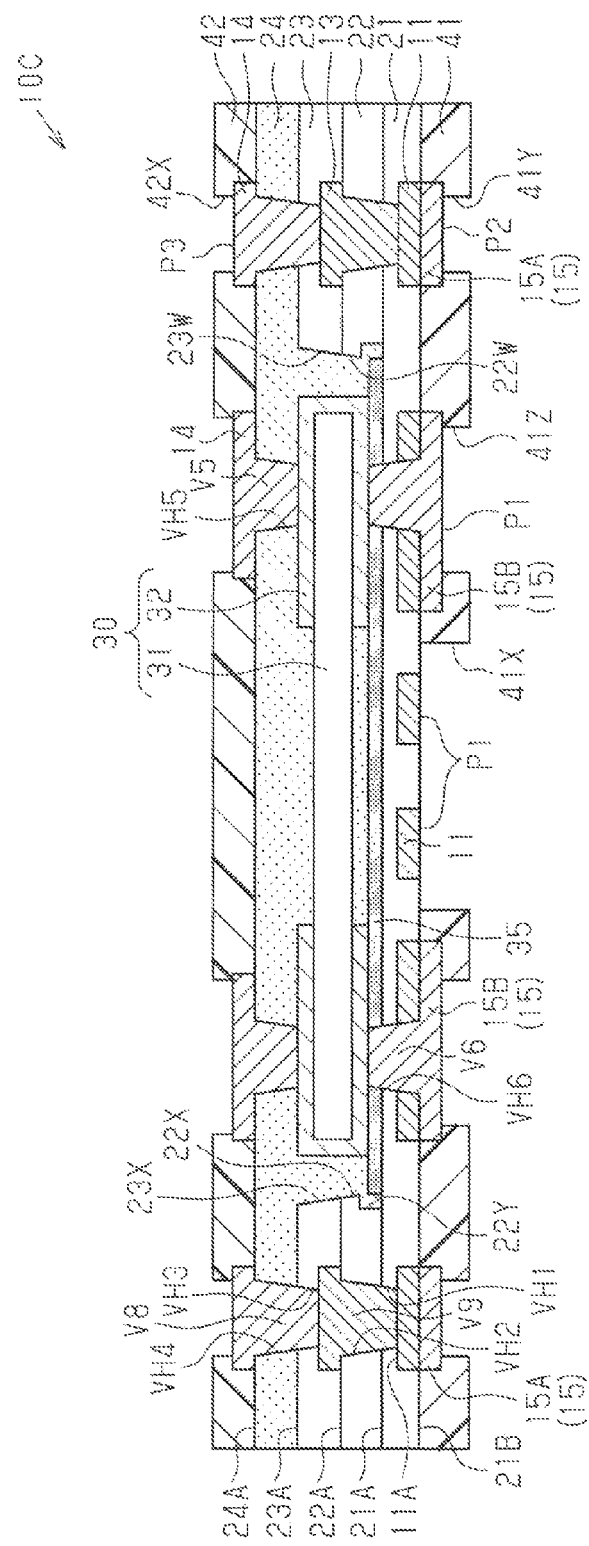
FIG. 18 is a schematic cross-sectional view illustrating a fourth embodiment of a wiring substrate.

As illustrated in FIG. 18, the wiring substrate 10C has a structure that sequentially stacks the wiring layer 15, the wiring layer 11, the insulation layer 21, the insulation layer 22, the wiring layer 13, the insulation layer 23, the insulation layer 24, and the wiring layer 14. Further, the wiring substrate 10C includes the chip capacitor 30, the solder resist layer 41, and the solder resist layer 42. The chip capacitor 30 is incorporated in the insulation layers 21 to 24.

The adhesive layer 35 is formed on the upper surface 21A of the insulation layer 21. The upper surface 21A of the insulation layer 21 is free from a wiring layer. The through holes VH1 extend through the insulation layer 21 in the thickness-wise direction at given locations and partially expose the upper surface 11A of the wiring layer 11.

The insulation layer 22 is stacked on the upper surface 21A of the insulation layer 21. The upper surface 22A of the insulation layer 22 is located at a lower position than the upper surface of each electrode terminal 32 of the chip capacitor 30 incorporated in the insulation layers 21 to 24. The thickness of the insulation layer 22 from the upper surface 21A of the insulation layer 21 to the upper surface 22A of the insulation layer 22 may be, for example, approximately 30 to 60 μm.

The through holes VH2 extend through the insulation layer 22 in the thickness-wise direction at given locations and partially expose the upper surface 11A of the wiring layer 11. The through holes VH2 are in communication with the through holes VH1 of the insulation layer 21. For example, the wall surfaces of the insulation layer 21 defining the through holes VH1 are continuous with the wall surfaces of the insulation layer 22 defining the through holes VH2. Each of the through holes VH1 and VH2 is, for example, tapered so that the diameter decreases, as viewed in FIG. 18, from the upper side toward the lower side.

The wiring layer 13 is stacked on the upper surface 22A of the insulation layer 22. The through holes VH1 and VH2 are filled with via wirings V9 that electrically connect the wiring layer 13 to the wiring layer 11. The wiring layer 13 is, for example, formed integrally with the via wirings V9.

The insulation layer 23 is formed on the upper surface 22A of the insulation layer 22 and covers the wiring layer 13. The insulation layer 23 has a thickness measured from the upper surface of the wiring layer 13 to the upper surface 23A of the insulation layer 23 that may be set to, for example, approximately 15 to 45 μm.

In the fourth embodiment, the insulation layer 21 is one example of a first insulation layer, the insulation layer 22 is one example of a second insulation layer, and the insulation layer 24 is one example of a third insulation layer. Further, the wiring layer 11 is one example of a first wiring layer, the wiring layer 15 is one example of a second wiring layer, the wiring layer 12 is one example of a third wiring layer, the wiring layer 13 is one example of a fourth wiring layer, and the wiring layer 14 is one example of a fifth wiring layer. Further, each combination of through holes VH1 and VH2 is one example of a fourth through hole, each through hole VH5 is one example of a fifth through hole, and each through hole VH6 is one example of a sixth through hole. Further, each via wiring V9 is one example of a fourth via wiring, each via wiring V5 is one example of a fifth via wiring, and each via wiring V6 is one example of a sixth via wiring.

A method for manufacturing the wiring substrate 10C will now be described. To aid understanding, components that ultimately function as the elements of the wiring substrate 10C are denoted by the reference characters added to such elements.

Figure 19A:
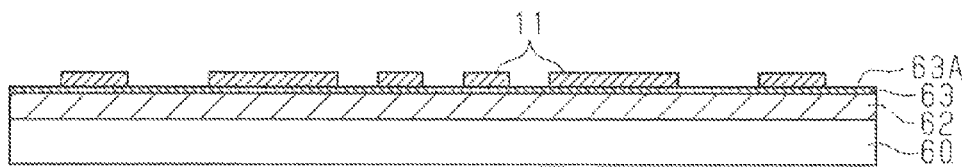
FIGS. 19A to 19C, 20A to 20D, and 21A to 21C are schematic cross-sectional views illustrating a method for manufacturing the wiring substrate of FIG. 18.
Figure 19B:
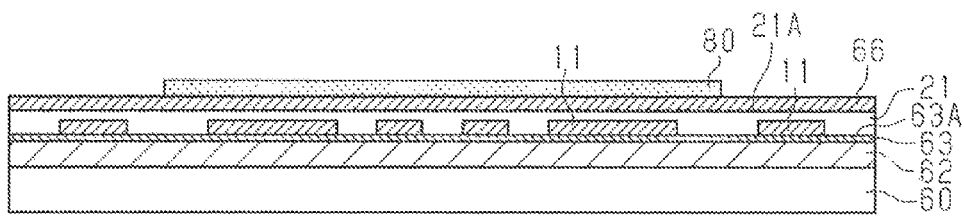

First, the same steps as the steps illustrated in FIGS. 4A and 4B are performed to manufacture the structure illustrated in FIG. 19A. In the step illustrated in FIG. 19B, the insulation layer 21, which entirely covers the wiring layer 11, is stacked on the upper surface 63A of the metal foil 63, and the metal foil 66, which entirely covers the wiring layer 11, is formed on the upper surface 21A of the insulation layer 21, in the same manner as the steps illustrated in FIGS. 4C and 4D. Then, a resist layer 80, which has a given pattern, is formed on the metal foil 66. The resist layer 80, which is located in the mounting region of the chip capacitor 30 (refer to FIG. 18), is larger than the opening 22X (refer to FIG. 18) in a plan view. The resist layer 80 may be formed from a material that is resistant to etching in the following etching process. For example, the resist layer 80 may be a photosensitive dry film resist or a photoresist liquid. Such a material of the resist layer 80 may be, for example, a novolac resin or an acrylic resin.

Figure 19C:
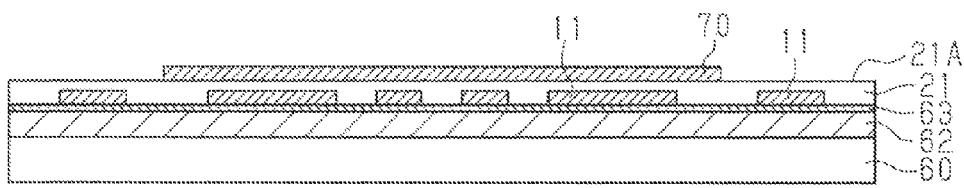

Then, etching is performed to remove the metal foil 66 using the resist layer 80 as an etching mask. As illustrated in FIG. 19C, this forms the metal layer 70 in the mounting region of the chip capacitor 30 (refer to FIG. 18). In this case, only the metal layer 70 is formed on the upper surface 21A of the insulation layer 21. Wiring layers are not formed on the upper surface 21A of the insulation layer 21. Then, for example, an alkaline defoliation liquid is used to remove the resist layer 80 illustrated in FIG. 19B.

Figure 20A:
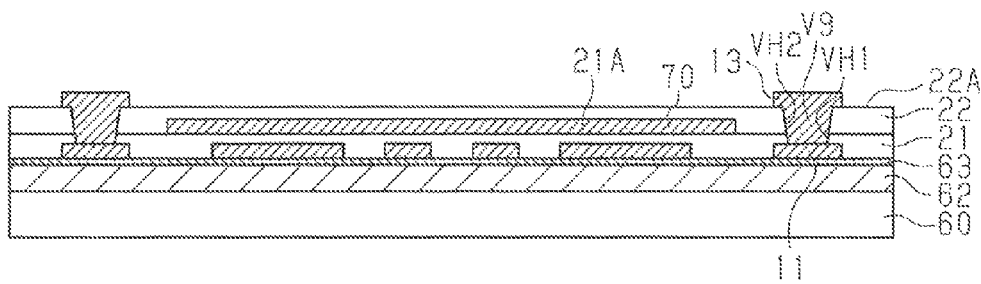

In the step illustrated in FIG. 20A, the insulation layer 22, which entirely covers the metal layer 70, is formed on the upper surface 21A of the insulation layer 21 in the same manner as the steps illustrated in FIGS. 4C to 5A. Further, the through holes VH2 are formed in the insulation layer 22, and the through holes VH1 are formed in the insulation layer 21. Then, the through holes VH1 and VH2 are filled with the via wirings V9 in the same manner as the steps illustrated in FIGS. 5B to 6B. Further, the wiring layer 13, which is electrically connected to the wiring layer 11 by the via wirings V9, is stacked on the upper surface 22A of the insulation layer 22.

Figure 20B:
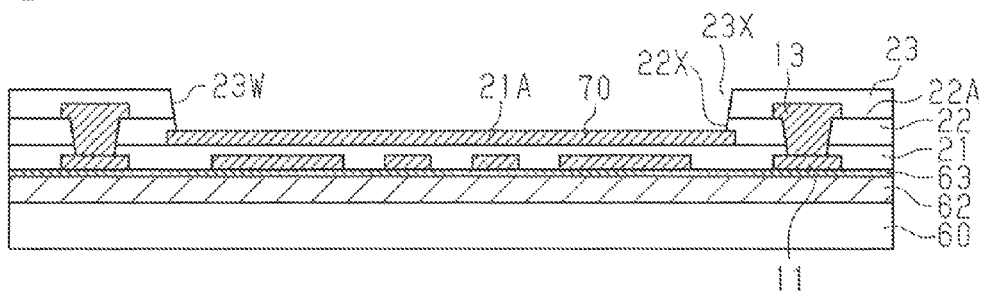

In the step illustrated in FIG. 20B, the insulation layer 23, which entirely covers the wiring layer 13, is formed on the upper surface 22A of the insulation layer 22 in the same manner as the step illustrated in FIG. 15C. Then, the openings 22X and 23X are formed extending through the insulation layers 22 and 23 in the thickness-wise direction, in the same manner as the step illustrated in FIG. 15D.

Figure 20C:
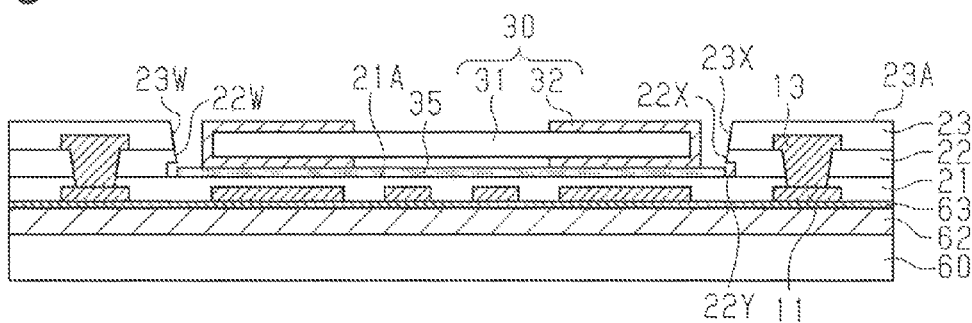

Then, in the same manner as the step illustrated in FIG. 7B, isotropic etching is performed using the insulation layers 22 and 23 as an etching mask to remove the metal layer 70. Consequently, as illustrated in FIG. 20C, the recess 22Y is formed below the opening 22X by the lower portion of the stepped inner wall surface 22W of the insulation layer 22.

Then, in the same manner as the steps illustrated in FIGS. 8B and 8C, the chip capacitor 30 is mounted on the upper surface 21A exposed in the openings 22X and 23X with the adhesive layer 35 arranged in between.

Figure 20D:
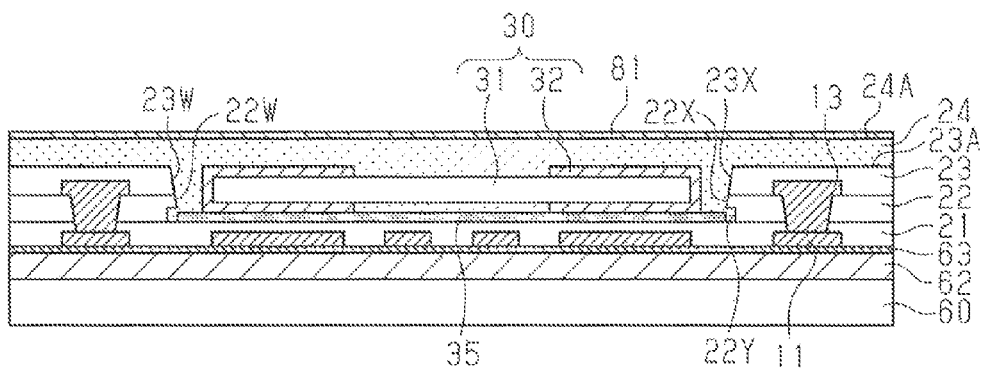

In the step illustrated in FIG. 20D, the insulation layer 24, which entirely covers the upper surface 23A of the insulation layer 23 and with which the openings 22X and 23X and the recess 22Y are filled, and a metal foil 81, which entirely covers the upper surface 24A of the insulation layer 24, are sequentially stacked on the upper surface 23A of the insulation layer 23 in the same manner as the steps illustrated in FIGS. 16B and 16C.

Then, the support 60 and the carrier layer 62 are removed. This exposes the lower surface of the metal foil 63 to the outside. In the step illustrated in FIG. 21A, the through holes VH4 and VH5 are formed extending through the metal foil 81 and the insulation layer 24. Further, the through holes VH3 are formed extending through the insulation layer 23 to be in communication with the through holes VH4. Further, the through holes VH6 are formed extending in the thickness-wise direction through the metal foil 63, the wiring layer 11, the insulation layer 21, and the adhesive layer 35.

Figure 21A:
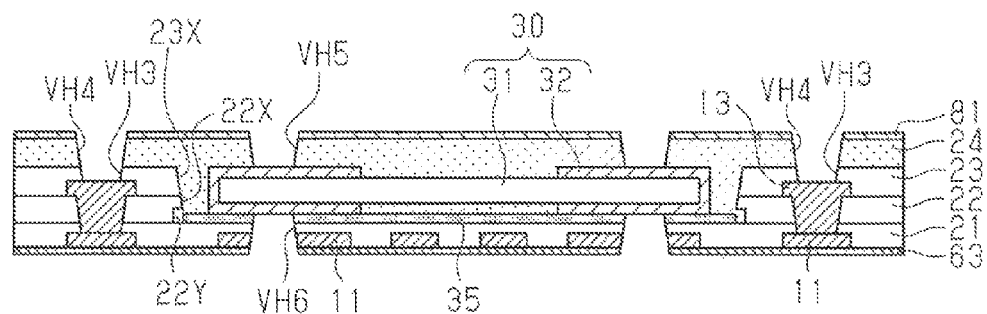
Figure 21B:
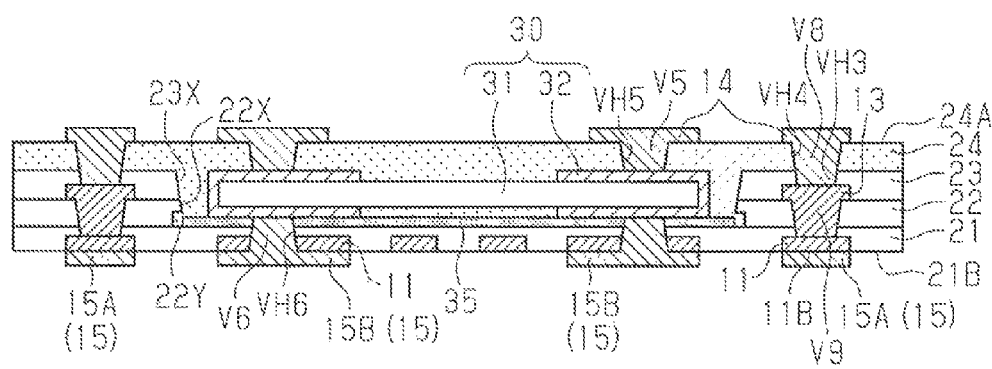

In the step illustrated in FIG. 21B, the wiring layer 14 is stacked on the upper surface 24A of the insulation layer 24, and the wiring layer 15 is stacked on the lower surface 11B of the wiring layer 11, in the same manner as the step illustrated in FIG. 17B.

Figure 21C:
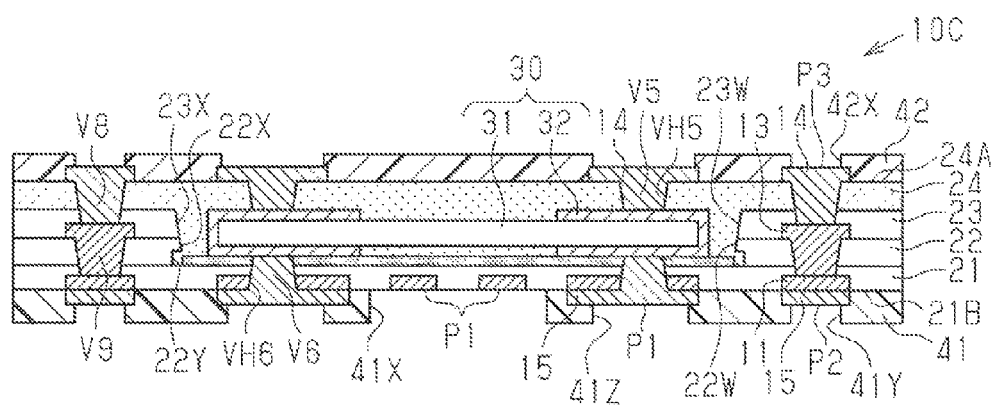

In the step illustrated in FIG. 21C, the solder resist layer 41 is stacked on the lower surface 21B of the insulation layer 21, and the solder resist layer 42 is stacked on the upper surface 24A of the insulation layer 24, in the same manner as the step illustrated in FIG. 17C.

The steps described above allow the wiring substrate 10C of the fourth embodiment to be manufactured.

The fourth embodiment has the same advantages as the third embodiment.

It should be apparent to those skilled in the art that the foregoing embodiments may be employed in many other specific forms without departing from the scope of the invention. Particularly, it should be understood that the foregoing embodiments may be employed in the following forms.

In each of the above embodiments, the through holes VH5 and the via wirings V5, with which the through holes VH5 are filled, may be omitted.

Figure 22:
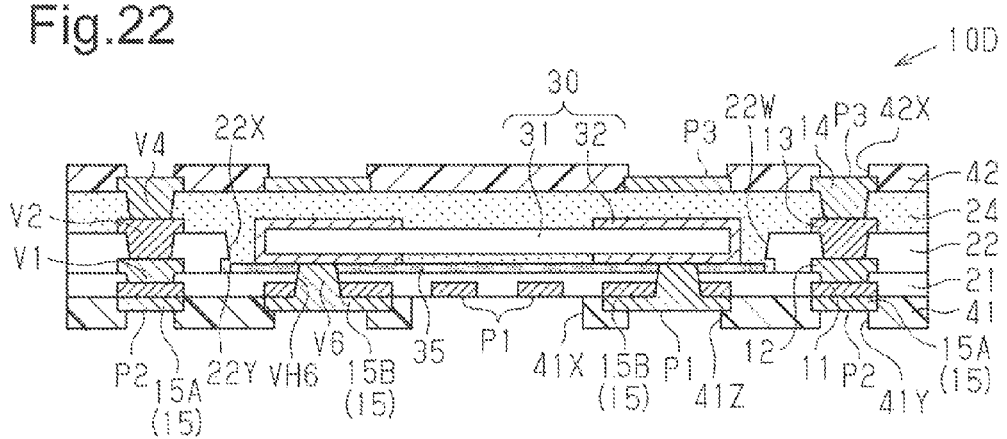
FIG. 22 is a schematic cross-sectional view illustrating a modified example of a wiring substrate.

For example, as illustrated in FIG. 22, the through holes VH5 and the via wirings V5, with which the through holes VH5 are filled, may be omitted from the structure of the wiring substrate 10 of the first embodiment (refer to FIG. 1A). For example, a wiring substrate 10D illustrated in FIG. 22 does not include via wirings that connect the wiring layer 14, which is located on the external connection terminal surface, and the chip capacitor 30. The wiring substrate 10D includes only the via wirings V6 that connect the wiring layer 15, which is located on the chip mounting surface, and the chip capacitor 30. In the wiring substrate 10D, the via wirings V6 are connected to only the lower surface of the electrode terminals 32 of the chip capacitor 30.

The wiring substrates 10A to 10C may be modified in the same manner as the modified example of the wiring substrate 10.

In the above embodiments and modified example, there is no limit to the number of chip capacitors 30 incorporated in the wiring substrates 10 and 10A to 10D.

Figure 23:
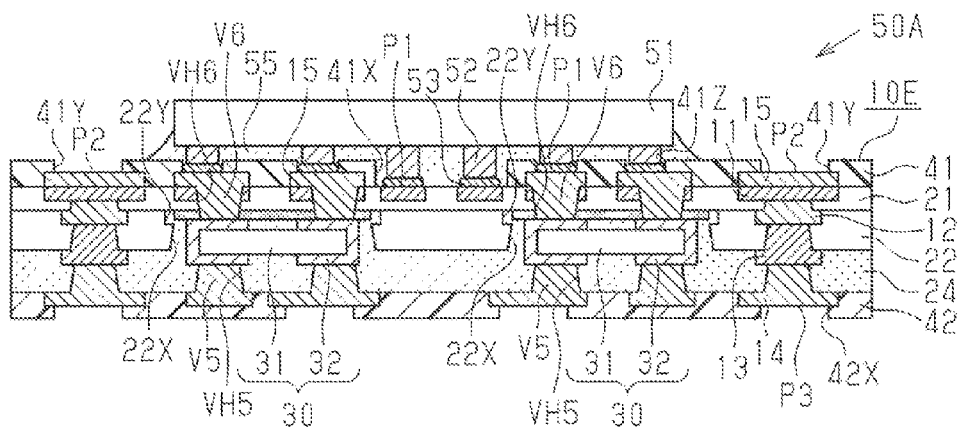
FIG. 23 is a schematic cross-sectional view illustrating a semiconductor device including a modified example of a wiring substrate.

For example, as illustrated in FIG. 23, a plurality of (here, two) chip capacitors 30 may be incorporated in a wiring substrate 10E. The wiring substrate 10E corresponds to the structure in which two chip capacitors 30 are incorporated in the wiring substrate 10 illustrated in FIG. 1A. The number of the openings 22X in the insulation layer 22 of the wiring substrate 10E is the same as the number of the incorporated chip capacitors 30. In this case, the number is two.

Figure 24:
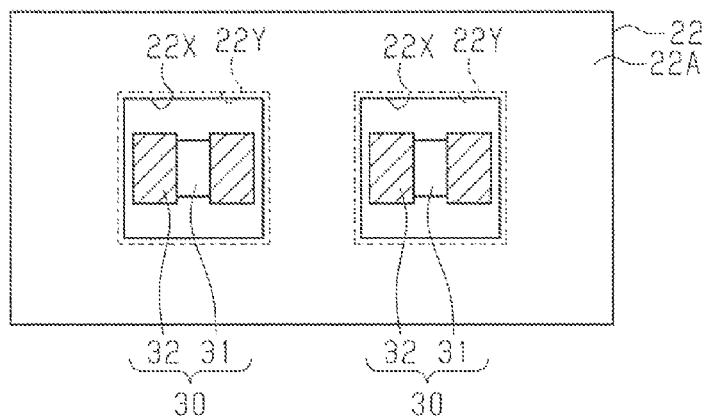
FIG. 24 is a schematic plan view illustrating the wiring substrate of FIG. 23.

For example, as illustrated in FIG. 24, the two openings 22X are independent from each other. Each opening 22X is tetragonal in a plan view. Each chip capacitor 30 is arranged in a corresponding one of the openings 22X. As illustrated in FIG. 23, the via wirings V5 in the through holes VH5 electrically connect the electrode terminals 32 of each chip capacitor 30 to the wiring layer 14, and the via wirings V6 in the through holes VH6 electrically connect the electrode terminals 32 of each chip capacitor 30 to the wiring layer 15.

The wiring substrates 10A to 10D may be modified in the same manner as the modified example of the wiring substrate 10E.

In the modified example illustrated in FIGS. 23 and 24, the number of incorporated chip capacitors 30 is the same as the number of the openings 22X. However, a plurality of chip capacitors 30 may be arranged in each of the openings 22X (or 22X and 23X).

In each of the above embodiments and modified examples, the recess 22Y may be omitted.

In each of the above embodiments and modified examples, the wiring substrates 10 and 10A to 10E incorporate the chip capacitor 30, which includes the two electrode terminals 32. Instead, the wiring substrates 10 and 10A to 10E may incorporate a chip capacitor 30 that includes three or more electrode terminals 32.

In each of the above embodiments and modified examples, the wiring substrates 10 and 10A to 10E incorporate the chip capacitor 30. However, the electronic component is not limited to the chip capacitor 30. For example, the incorporated electronic component may be a chip resistor, an inductor, or a semiconductor device (LSI). Further, the electronic component incorporated in the wiring substrates 10 and 10A to 10E is not limited to one type and may be more than one type.

In the above embodiments and modified examples, the number of semiconductor chips 51 mounted on the wiring substrates 10 and 10E of the semiconductor devices 50 and 50A and the mounting mode of the semiconductor chip 51 (e.g., flip-chip mounting, wire bonding mounting, or a combination of flip-chip mounting and wire bonding mounting) may be changed.

In each of the above embodiments and modified examples, the semiconductor chip 51 may be mounted on the wiring substrates 10A to 10D.

The wiring substrates 10B and 10C include the two insulation layers 22 and 23 used to form a cavity but may instead include three or more layers to form a cavity.

In the wiring substrates 10 and 10A to 10E of each of the above embodiments and modified examples, there is particularly no limit to the number of wiring layers and insulation layers stacked on the upper surface 24A of the insulation layer 24, with which the cavity is filled. For example, the wiring layer 14, an insulation layer that covers the wiring layer 14, and a wiring layer stacked on the insulation layer may be sequentially stacked on the upper surface 24A of the insulation layer 24.

In the wiring substrates 10 and 10A to 10E of each of the above embodiments and modified examples, there is particularly no limit to the number of wiring layers and insulation layers stacked on the lower surface of the insulation layer 22, which is used to form the cavity. For example, after alternately forming a plurality of wiring layers and a plurality of insulation layers one after another on the upper surface 21A of the insulation layer 21, the insulation layer 22 may be stacked to form the cavity. In other words, in each of the above embodiments and modified examples, "the first insulation layer" includes only the single insulation layer 21 but may include a plurality of insulation layers.

In each of the above embodiments, a coreless wiring substrate is manufactured by mainly using the build-up process to stack a wiring layer and an insulation layer on one surface (either one of upper surface and lower surface) of the support substrate and finally removing the support substrate. Instead, for example, a plurality of coreless wiring substrates may be manufactured by arranging the carrier-added metal foil 61 on both surfaces (both upper and lower surfaces) of a support substrate, mainly using the build-up process to stack a wiring layer and an insulation layer on the two sides (one surface and other surface) of the support substrate, and finally removing the support substrate. In this case, the wiring layer and the insulation layer may be sequentially stacked on each of the upper and lower surfaces of the support substrate from the chip-mounting surface in the same manner as, for example, the steps illustrated in FIGS. 4A to 9A. Although this is a modified example of the first embodiment, the second to fourth embodiments may be modified in the same manner.

In each of the above embodiments, the support substrate includes the support 60 and the carrier-added metal foil 61 (carrier layer 62 and metal foil 63). Instead, for example, the carrier-added metal foil 61 may be omitted, and the support substrate may include only the support 60.

In the method for manufacturing the wiring substrates 10 and 10A to 10C in the above embodiments, the metal foils 63, 66, 71, 73, 76, 77, 78, and 81 may be omitted.

In each of the above embodiments, a single wiring substrate is manufactured. However, the above embodiments may be applied when manufacturing a plurality of wiring substrates.

Figure 25:
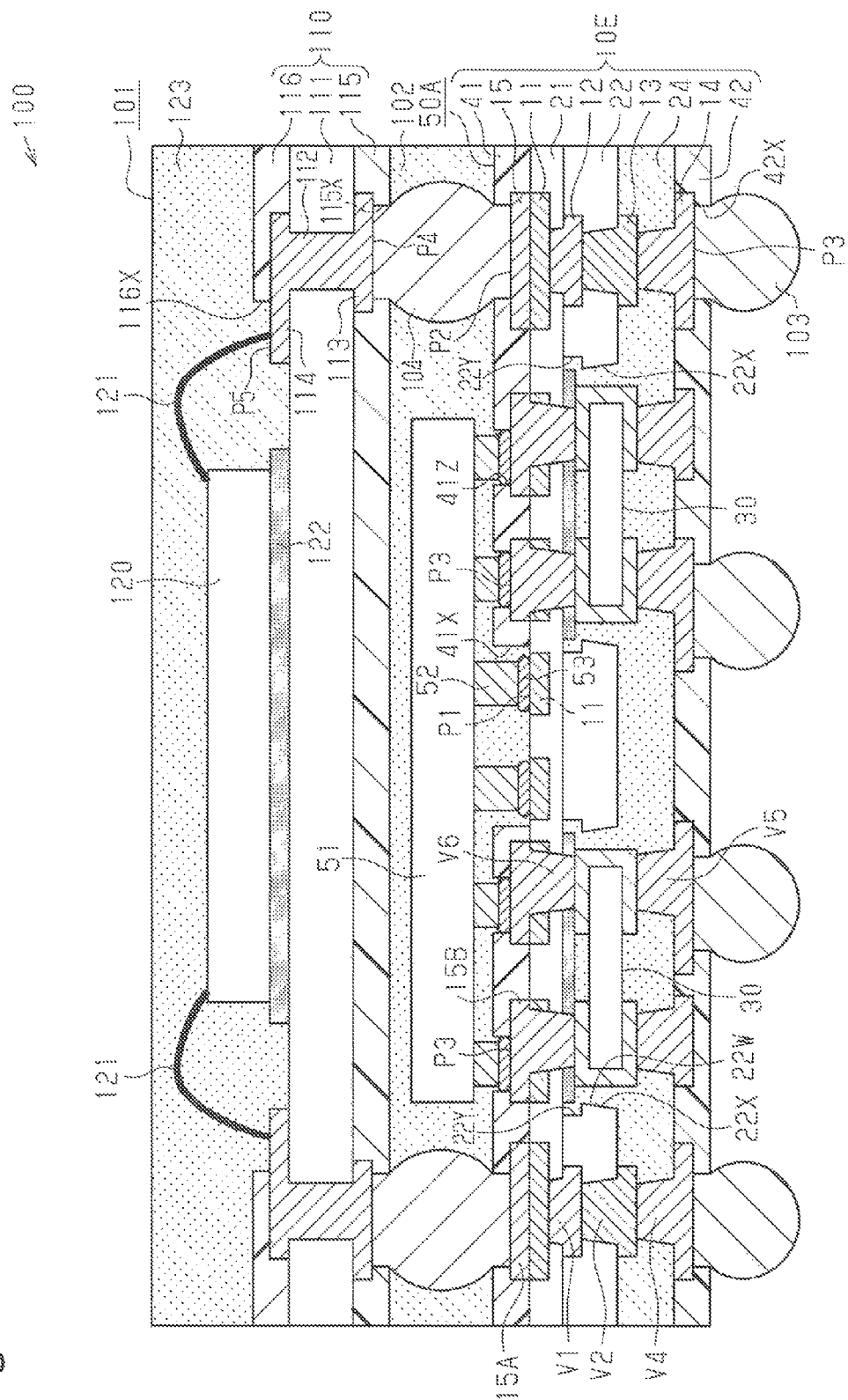
FIG. 25 is a schematic cross-sectional view illustrating an example to which the wiring substrate of FIG. 23 is applied.

With reference to FIG. 25, an example of an application of the wiring substrate 10E will now be described. A semiconductor device 100 that includes a semiconductor package 101 in addition to the wiring substrate 10E will be described.

The semiconductor device 100 includes a wiring substrate 10E, a semiconductor chip 51 mounted on the wiring substrate 10E, and a semiconductor package 101 stacked on and bonded to the wiring substrate 10E. The semiconductor device 100 includes an encapsulation resin 102, which is formed in a gap between the wiring substrate 10E and a wiring substrate 110 of the semiconductor package 101, and external connection terminals 103.

One example of the structure of the semiconductor package 101 will now be described.

The semiconductor package 101 includes the wiring substrate 110, at least one (here, one) semiconductor chip 120, bonding wires 121 electrically connecting the semiconductor chip 120 and the wiring substrate 110, and an encapsulation resin 123 that encapsulates the semiconductor chip 120 and the like.

The wiring substrate 110 includes a core substrate 111, through electrodes 112, a lowermost wiring layer 113 formed on the lower surface of the core substrate 111, an uppermost wiring layer 114 formed on the upper surface of the core substrate 111, and solder resist layers 115 and 116. The through electrodes 112 electrically connect the wiring layers 113 and 114 to each other.

The solder resist layer 115 is stacked on the lower surface of the core substrate 111 to partially cover the wiring layer 113. The solder resist layer 115 includes openings 115X that expose portions of the wiring layer 113 as connection pads P4. The connection pads P4 face the connection pads P2 of the wiring substrate 10E and are electrically connected to the connection pads P2.

The solder resist layer 116 is stacked on the upper surface of the core substrate 111 to partially cover the wiring layer 114. The solder resist layer 116 includes an opening 116X exposing portions of the wiring layer 114 as pads P5. The pads P5 function as electronic component mounting pads electrically connected to an electronic component such as a semiconductor chip or a passive element.

The wiring substrate 110 is not limited to a wiring substrate that includes the core substrate 111 and may be a coreless wiring substrate that does not include the core substrate 111.

The semiconductor chip 120 is wire-bonded to the wiring substrate 110. In the present example, the semiconductor chip 120 is adhered to the upper surface of the core substrate 111 by an adhesive layer 122. The bonding wires 121 electrically connect electrodes (not illustrated) of the semiconductor chip 120 to the pads P5. The mounting mode of the semiconductor chip 120 is not particularly limited. For example, the semiconductor chip 120 may be flip-chip mounted on the wiring substrate 110.

The encapsulation resin 123 is formed on the upper surface of the wiring substrate 110 to encapsulate the semiconductor chip 120 and the bonding wires 121.

Solder balls 104 are bonded to the connection pads P2 of the wiring substrate 10E and the connection pads P4 of the wiring substrate 110. The solder balls 104 are located between the wiring substrate 10E and the semiconductor package 101. Each solder ball 104 may be, for example, a conductive core ball (copper core ball) or a solder ball having a structure in which a resin core ball is covered with solder. The solder ball 104 does not have to include a core ball (conductive core ball or resin core ball).

In this manner, the solder balls 104 bond the wiring substrate 10E and the semiconductor package 101 to form the semiconductor device 100 that has a package on package (POP) structure.

The gap between the wiring substrate 10E and the wiring substrate 110 is filled with the encapsulation resin 102. The encapsulation resin 102 fixes the wiring substrate 110 to the wiring substrate 10E and encapsulates the semiconductor chip 51, which is mounted on the wiring substrate 10E. Accordingly, the encapsulation resin 102 functions as an adhesive that adheres the wiring substrate 10E and the wiring substrate 110 and as a protective layer that protects the semiconductor chip 51.

The external connection terminals 103 are formed on the external connection pads P3 of the wiring substrate 10E. The external connection terminals 103 are electrically connected to pads on a mounting substrate such as a motherboard (not illustrated). The external connection terminals 103 may be, for example, solder balls or lead pins.

An example of an application of the wiring substrate 10E has been described. Instead of the wiring substrate 10E, the wiring substrates 10 and 10A to 10D may be applied to the structure of FIG. 25 in the same manner.

In the above embodiments and the modified examples, each of the wiring substrates 10 and 10A to 10E is applied to an electronic component incorporated substrate that incorporates the chip capacitor 30 (i.e., electronic component). Instead, each of the wiring substrates 10 and 10A to 10E may be applied to a wiring substrate that does not incorporate the electronic component. An example of such a wiring substrate will now be described.

Figure 26:
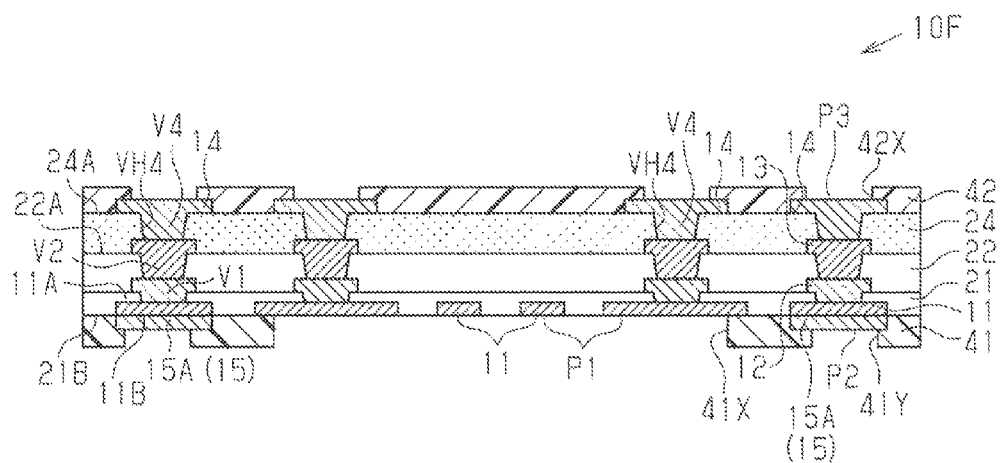
FIG. 26 is a schematic cross-sectional view illustrating a further modified example of a wiring substrate.

For example, a wiring substrate 10F illustrated in FIG. 26 has a structure that sequentially stacks the wiring layer 11, the insulation layer 21, the wiring layer 12, the insulation layer 22, the wiring layer 13, the insulation layer 24, and the wiring layer 14. The wiring substrate 10F is a coreless wiring substrate.

In the wiring substrate 10F, the cavity (i.e., opening 22X and recess 22Y in FIG. 1A) is not formed in the insulation layer 22. The insulation layer 24 covers the entire upper surface 22A of the insulation layer 22 exposed from the wiring layer 13. Further, the through holes VH5 (refer to FIG. 1A) are not formed in the insulation layer 24. In the insulation layer 24, only the through holes VH4 are formed extending in the thickness-wise direction through the insulation layer 24 to expose portions of the upper surface of the wiring layer 13. Accordingly, all portions of the wiring layer 14 formed on the upper surface 24A of the insulation layer 24 are electrically connected to the wiring layer 13 by the via wirings V4 with which the through holes VH4 are filled.

In the same manner as the above embodiments, the insulation layer 21 covers the upper surface 11A and the side surfaces of the wiring layer 11 and exposes the lower surface 11B of the wiring layer 11. The wiring layer 15 is stacked on a portion of the lower surface 11B of the wiring layer 11. In the present example, the wiring layer 15 includes the first wiring patterns 15A that are stacked directly on the lower surface 11B of the wiring layer 11 and directly and electrically connected to the wiring layer 11.

The solder resist layer 41 is stacked on the lower surface 21B of the insulation layer 21, and the solder resist layer 42 is stacked on the upper surface 24A of the insulation layer 24. The solder resist layer 41 includes the opening 41X, which exposes portions of the wiring layer 11 as the pads P1, and the openings 41Y, which expose portions of the wiring layer 15 as the pads P2. The solder resist layer 42 includes the openings 42X that expose portions of the wiring layer 14 as the external connection pads P3.

The wiring substrate 10F described above also has the advantages (1), (2), and (9) of the first embodiment. The structure of the wiring substrate 10F has been described as the modified example of the wiring substrate 10. Instead, the structure of the wiring substrate 10F may be applied to the wiring substrates 10A to 10E in the same manner.

Figure 27:
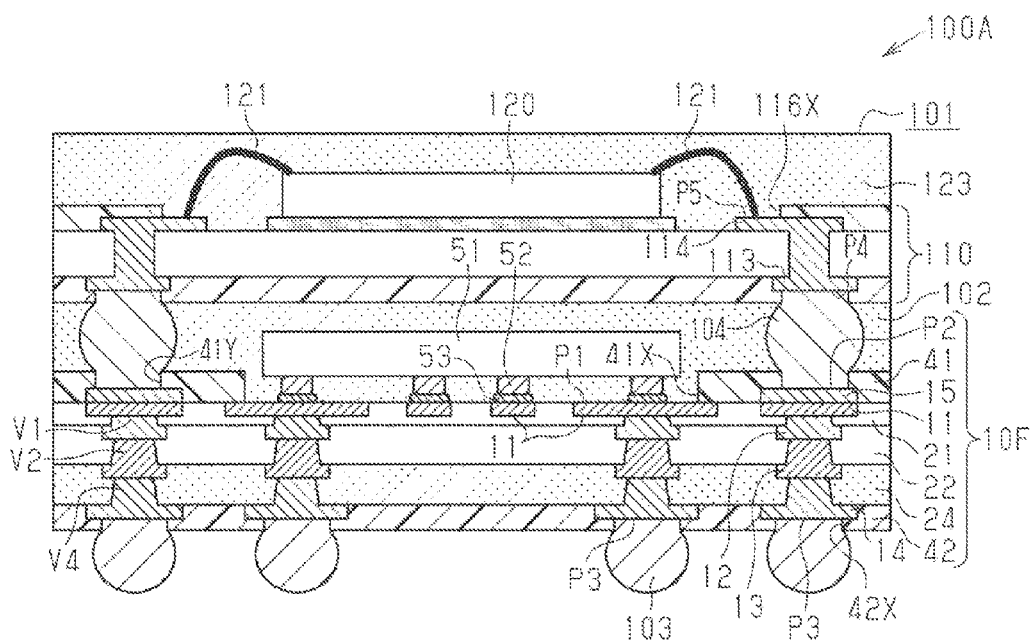
FIG. 27 is a schematic cross-sectional view illustrating an example to which the wiring substrate of FIG. 26 is applied.

With reference to FIG. 27, an example of an application of the wiring substrate 10F will now be described. A semiconductor device 100A that includes a semiconductor package 101 in addition to the wiring substrate 10F will be described.

The semiconductor device 100A includes the wiring substrate 10F, the semiconductor chip 51 mounted on the wiring substrate 10F, and the semiconductor package 101 stacked on and bonded to the wiring substrate 10F. The semiconductor device 100A includes the encapsulation resin 102, which is formed in a gap between the wiring substrate 10F and the wiring substrate 110 of the semiconductor package 101, and external connection terminals 103.

Solder balls 104 are bonded to the connection pads P2 of the wiring substrate 10F and the connection pads P4 of the wiring substrate 110. The solder balls 104 are located between the wiring substrate 10F and the semiconductor package 101.

In this manner, the solder balls 104 bond the wiring substrate 10F and the semiconductor package 101 to form the semiconductor device 100A that has a package on package (POP) structure.

In the wiring substrates 10 and 10A to 1° F. of the above embodiments and the modified examples, the surface on the side where the pads P1 are formed defines the chip mounting surface, and the surface on the side where the external connection pads P3 are formed defines the external connection terminal surface. Instead, for example, the surface on the side where the pads P1 are formed may define the external connection terminal surface, and the surface on the side where the external connection terminal pads P3 are formed may define the chip mounting surface.

The above embodiments and the modified examples may be combined as appropriate. For example, the wiring patterns 15B and 15C in the second embodiment may be formed in the wiring substrates 10 and 10B to 1° F. of the other embodiments. For example, in the wiring substrate 10C of the fourth embodiment, the wiring patterns 15C may be formed on the lower surface 21B of the insulation layer 21 to be electrically connected to the wiring layer 13 by the via wirings V9 with which the through holes VH1 and VH2 extending through the insulation layers 21 and 22 are filled.

Clauses

This disclosure encompasses the following embodiments.

1. A method for manufacturing a wiring substrate, the method including:
   preparing a support substrate;
   forming a first wiring layer on an upper surface of the support substrate;
   forming a first insulation layer on the upper surface of the support substrate, wherein the first insulation layer covers an upper surface and a side surface of the first wiring layer;
   removing the support substrate; and
   forming a second wiring layer, after removing the support substrate, on at least one of a lower surface of the first insulation layer and a lower surface of the first wiring layer.

2. The method according to clause 1, wherein the forming a second wiring layer includes forming a wiring pattern directly stacked on the lower surface of the first wiring layer and directly connected to the first wiring layer.

3. The method according to clause 1 or 2, further including:
   prior to the removal of the support substrate,
      forming a third wiring layer on an upper surface of the first insulation layer,
      forming a second insulation layer, which covers the third wiring layer, on the upper surface of the first insulation layer,
      forming a first through hole that extends through the second insulation layer and exposes an upper surface of the third wiring layer,
      filling the first through hole with a first via wiring, and
      forming a fourth wiring layer on an upper surface of the second insulation layer, wherein the fourth wiring layer is electrically connected to the third wiring layer by the first via wiring; and
   subsequent to the removal of the support substrate,
      forming a second through hole that extends through the first insulation layer and exposes a lower surface of the third wiring layer,
      filling the second through hole with a second via wiring, and
      forming the second wiring layer on the lower surface of the first insulation layer, wherein the second wiring layer includes a wiring pattern electrically connected to the third wiring layer by the second via wiring;
   wherein the first through hole includes a lower opening end at a side closer to the third wiring layer and an upper opening end at a side closer to the fourth wiring layer, and the first through hole is tapered so that the lower opening end of the first through hole is smaller than the upper opening end of the first through hole; and
   the second through hole includes an upper opening end at a side closer to the third wiring layer and a lower opening end at a side closer to the second wiring layer, and the second through hole is tapered so that the upper opening end of the second through hole is smaller than the lower opening end of the second through hole.

4. The method according to any one of clauses 1 to 3, further including:
   prior to the removal of the support substrate,
      forming a metal layer on an upper surface of the first insulation layer,
      forming a second insulation layer, which covers the metal layer, on the upper surface of the first insulation layer,
      forming an opening that extends through the second insulation layer and partially exposes an upper surface of the metal layer,
      removing the metal layer to form a recess that is in communication with the opening, wherein the opening and the recess define a cavity,
      mounting an electronic component on the upper surface of the first insulation layer exposed in the cavity, and
      forming a third insulation layer that covers the electronic component and an upper surface of the second insulation layer, wherein the cavity is filled with the third insulation layer; and
   subsequent to the removal of the support substrate,
      forming a third through hole that extends through the third insulation layer and exposes an upper surface of the electronic component,
      forming a fourth through hole that extends through the first insulation layer and exposes a lower surface of the electronic component,
      filling the third through hole with a third via wiring,
      filling the fourth through hole with a fourth via wiring,
      forming a fifth wiring layer on an upper surface of the third insulation layer, wherein the fifth wiring layer is electrically connected to the electronic component by the third via wiring, and
      forming the second wiring layer on the lower surface of the first insulation layer, wherein the second wiring layer includes a wiring pattern electrically connected to the electronic component by the fourth via wiring;
   wherein the third through hole includes a lower opening end at a side closer to the electronic component and an upper opening end at a side closer to the fifth wiring layer, and the third through hole is tapered so that the lower opening end of the third through hole is smaller than the upper opening end of the third through hole; and
   the fourth through hole includes an upper opening end at a side closer to the electronic component and a lower opening end at a side closer to the second wiring layer, and the fourth through hole is tapered so that the upper opening end of the fourth through hole is smaller than the lower opening end of the fourth through hole.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the spirit and scope of the invention.

The invention claimed is:

1. A wiring substrate comprising:
   a first wiring layer;
   a first insulation layer that covers an upper surface and a side surface of the first wiring layer and exposes a lower surface of the first wiring layer;
   a second wiring layer stacked on at least one of a lower surface of the first insulation layer and the lower surface of the first wiring layer,
   a second insulation layer stacked on an upper surface of the first insulation layer;
   a cavity extending through the second insulation layer and partially exposing the upper surface of the first insulation layer;
   an electronic component mounted on the upper surface of the first insulation layer exposed in the cavity; and a third insulation layer that covers the electronic component and an upper surface of the second insulation layer, wherein the cavity is filled with the third insulation layer.

2. The wiring substrate according to claim 1, wherein the second wiring layer includes a wiring pattern directly stacked on the lower surface of the first wiring layer and directly connected to the first wiring layer.

3. The wiring substrate according to claim 1, further comprising:
a third wiring layer stacked on an upper surface of the first insulation layer and covered by the second insulation layer;
a first via wiring with which a first through hole is filled, wherein the first through hole extends through the second insulation layer to an upper surface of the third wiring layer;
a fourth wiring layer stacked on an upper surface of the second insulation layer and electrically connected to the third wiring layer by the first via wiring; and
a second via wiring with which a second through hole is filled, wherein the second through hole extends through the first insulation layer to an upper surface of the second wiring layer, wherein
the second wiring layer includes a wiring pattern stacked on the lower surface of the first insulation layer and electrically connected to the third wiring layer by the second via wiring,
the first through hole includes a lower opening end at a side closer to the third wiring layer and an upper opening end at a side closer to the fourth wiring layer, and the first through hole is tapered so that the lower opening end of the first through hole is smaller than the upper opening end of the first through hole, and
the second through hole includes an upper opening end at a side closer to the third wiring layer and a lower opening end at a side closer to the second wiring layer, and the second through hole is tapered so that the upper opening end of the second through hole is smaller than the lower opening end of the second through hole.

4. The wiring substrate according to claim 1, further comprising:
a third wiring layer stacked on an upper surface of the first insulation layer and covered by the second insulation layer;
a first via wiring with which a first through hole is filled, wherein the first through hole extends through the second insulation layer to an upper surface of the third wiring layer;
a fourth wiring layer stacked on an upper surface of the second insulation layer and electrically connected to the third wiring layer by the first via wiring; and
a third via wiring with which a third through hole is filled, wherein the third through hole extends through the first insulation layer to the upper surface of the first wiring layer, wherein
the second wiring layer includes a wiring pattern directly stacked on the lower surface of the first wiring layer and electrically connected to the third wiring layer by the first wiring layer and the third via wiring,
the first through hole includes a lower opening end at a side closer to the third wiring layer and an upper opening end at a side closer to the fourth wiring layer, and the first through hole is tapered so that the lower opening end of the first through hole is smaller than the upper opening end of the first through hole, and the third through hole includes an upper opening end at a side closer to the third wiring layer and a lower opening end at a side closer to the first wiring layer, and the third through hole is tapered so that the lower opening end of the third through hole is smaller than the upper opening end of the third through hole.

5. The wiring substrate according to claim 1, further comprising:
a fourth via wiring with which a fourth through hole is filled, wherein the fourth through hole extends through the first insulation layer and the second insulation layer to the upper surface of the first wiring layer; and
a fourth wiring layer stacked on an upper surface of the second insulation layer and electrically connected to the first wiring layer by the fourth via wiring, wherein
the second wiring layer includes a wiring pattern directly stacked on the lower surface of the first wiring layer and electrically connected to the fourth wiring layer by the first wiring layer and the fourth via wiring, and
the fourth through hole includes a lower opening end at a side closer to the first wiring layer and an upper opening end at a side closer to the fourth wiring layer, and the fourth through hole is tapered so that the lower opening end of the fourth through hole is smaller than the upper opening end of the fourth through hole.

6. The wiring substrate according to claim 1, further comprising:
a fifth via wiring with which a fifth through hole extending through the third insulation layer is filled, wherein the fifth via wiring is connected to an upper end of the electronic component;
a fifth wiring layer stacked on an upper surface of the third insulation layer and electrically connected to the electronic component by the fifth via wiring; and
a sixth via wiring with which a sixth through hole extending through the first insulation layer is filled, wherein the sixth via wiring is connected to a lower end of the electronic component, wherein
the second wiring layer includes a wiring pattern electrically connected to the electronic component by the sixth via wiring,
the fifth through hole includes a lower opening end at a side closer to the electronic component and an upper opening end at a side closer to the fifth wiring layer, and the fifth through hole is tapered so that the lower opening end of the fifth through hole is smaller than the upper opening end of the fifth through hole, and
the sixth through hole includes an upper opening end at a side closer to the electronic component and a lower opening end at a side closer to the second wiring layer, and the sixth through hole is tapered so that the upper opening end of the sixth through hole is smaller than the lower opening end of the sixth through hole.

7. A wiring substrate comprising:
a first wiring layer;
a first insulation layer that covers an upper surface and a side surface of the first wiring layer and exposes a lower surface of the first wiring layer;
a second wiring layer stacked on at least one of a lower surface of the first insulation layer and the lower surface of the first wiring layer;
a third wiring layer stacked on an upper surface of the first insulation layer;
a second insulation layer stacked on the upper surface of the first insulation layer to cover the third wiring layer;

a first via wiring with which a first through hole is filled, wherein the first through hole extends through the second insulation layer to an upper surface of the third wiring layer;

a fourth wiring layer stacked on an upper surface of the second insulation layer and electrically connected to the third wiring layer by the first via wiring; and a second via wiring with which a second through hole is filled, wherein the second through hole extends through the first insulation layer to an upper surface of the second wiring layer, wherein the second wiring layer includes a wiring pattern stacked on the lower surface of the first insulation layer and electrically connected to the third wiring layer by the second via wiring, the first through hole includes a lower opening end at a side closer to the third wiring layer and an upper opening end at a side closer to the fourth wiring layer, and the first through hole is tapered so that the lower opening end of the first through hole is smaller than the upper opening end of the first through hole, and the second through hole includes an upper opening end at a side closer to the third wiring layer and a lower opening end at a side closer to the second wiring layer, and the second through hole is tapered so that the upper opening end of the second through hole is smaller than the lower opening end of the second through hole.

8. A wiring substrate comprising:

a first wiring layer;

a first insulation layer that covers an upper surface and a side surface of the first wiring layer and exposes a lower surface of the first wiring layer;

a second wiring layer stacked on at least one of a lower surface of the first insulation layer and the lower surface of the first wiring layer;

a third wiring layer stacked on an upper surface of the first insulation layer;

a second insulation layer stacked on the upper surface of the first insulation layer to cover the third wiring layer;

a first via wiring with which a first through hole is filled, wherein the first through hole extends through the second insulation layer to an upper surface of the third wiring layer;

a fourth wiring layer stacked on an upper surface of the second insulation layer and electrically connected to the third wiring layer by the first via wiring; and a third via wiring with which a third through hole is filled, wherein the third through hole extends through the first insulation layer to the upper surface of the first wiring layer, wherein the second wiring layer includes a wiring pattern directly stacked on the lower surface of the first wiring layer and electrically connected to the third wiring layer by the first wiring layer and the third via wiring, the first through hole includes a lower opening end at a side closer to the third wiring layer and an upper opening end at a side closer to the fourth wiring layer, and the first through hole is tapered so that the lower opening end of the first through hole is smaller than the upper opening end of the first through hole, and the third through hole includes an upper opening end at a side closer to the third wiring layer and a lower opening end at a side closer to the first wiring layer, and the third through hole is tapered so that the lower opening end of the third through hole is smaller than the upper opening end of the third through hole.

9. A wiring substrate comprising:

a first wiring layer;

a first insulation layer that covers an upper surface and a side surface of the first wiring layer and exposes a lower surface of the first wiring layer;

a second wiring layer stacked on at least one of a lower surface of the first insulation layer and the lower surface of the first wiring layer;

a second insulation layer stacked on an upper surface of the first insulation layer;

a fourth via wiring with which a fourth through hole is filled, wherein the fourth through hole extends through the first insulation layer and the second insulation layer to the upper surface of the first wiring layer; and a fourth wiring layer stacked on an upper surface of the second insulation layer and electrically connected to the first wiring layer by the fourth via wiring, wherein the second wiring layer includes a wiring pattern directly stacked on the lower surface of the first wiring layer and electrically connected to the fourth wiring layer by the first wiring layer and the fourth via wiring, and the fourth through hole includes a lower opening end at a side closer to the first wiring layer and an upper opening end at a side closer to the fourth wiring layer, and the fourth through hole is tapered so that the lower opening end of the fourth through hole is smaller than the upper opening end of the fourth through hole.

* * * * *